United States Patent [19]

Amemiya et al.

[11] 4,063,236
[45] Dec. 13, 1977

[54] ANALOG-DIGITAL CONVERTER

[75] Inventors: Hiroshi Amemiya, Fujisawa; Tadaaki Tarui, Kawasaki; Tsuneo Yoneyama, Yokosuka, all of Japan

[73] Assignee: Tokyo Shibaura Electric Co., Ltd., Tokyo, Japan

[21] Appl. No.: 625,672

[22] Filed: Oct. 24, 1975

[30] Foreign Application Priority Data

Oct. 24, 1974 Japan .................. 49-121925
Oct. 24, 1974 Japan .................. 49-121927
Oct. 24, 1974 Japan .................. 49-121928

[51] Int. Cl.² ........................................... H03K 13/20
[52] U.S. Cl. ...................... 340/347 NT; 340/347 AD
[58] Field of Search ................. 340/347 NT, 347 AD; 324/99 D

[56] References Cited

U.S. PATENT DOCUMENTS

| | | | |
|---|---|---|---|
| 3,733,600 | 5/1973 | Hellwarth | 340/347 NT |
| 3,735,394 | 5/1973 | Eto | 340/347 NT |
| 3,736,586 | 5/1973 | Donjon | 340/347 NT |
| 3,828,347 | 8/1974 | Sacks | 340/347 NT |
| 3,842,416 | 10/1974 | Eto | 340/347 NT |
| 3,872,466 | 3/1975 | Wold | 340/347 NT |
| 3,942,173 | 3/1976 | Wold | 340/347 NT |

*Primary Examiner*—Charles D. Miller
*Attorney, Agent, or Firm*—Finnegan, Henderson, Farabow & Garrett

[57] ABSTRACT

An analog-digital converter which comprises first and second signal input terminals selectively supplied with any of an input analog voltage and first and second reference voltages having the same polarity as said input analog voltage but different levels from each other; an integration circuit consisting of first and second integration resistors having substantially the same value of resistance and connected to the corresponding first and second input terminals, a D.C. amplifier provided with an inversion input terminal selectively connected to the first and second integration resistors and a noninversion input terminal impressed with a voltage whose level lies intermediate between those of the first and second reference voltages, and an integration capacitor connected between the output terminal of the D.C. amplifier and inversion input terminal; an analog comparator, one input terminal of which is connected to the output terminal of the D.C. amplifier and the other input terminal of which is impressed with a voltage having a reference level for comparison; and a control circuit including means for applying the first reference voltage to the first and second signal input terminals for a prescribed time $T_1$, means for impressing the second reference voltage on the first and second signal input terminals and measuring a time $T_2$ required for an analog comparator to generate an output signal after coincidence is established between the levels of the second reference voltage and comparison reference voltage, means for determining a difference $\Delta T$ between the aforesaid times $T_1$, $T_2$, means for specifying a prescribed time $T_3$ according to said difference $\Delta T$, and means for supplying the input analog voltage to the first signal input terminal only for the substantial first half $T_3/2$ of said specified prescribed time $T_3$, impressing the first or second reference voltage on the second signal input terminal, supplying the first signal input terminal with the reference voltage previously impressed during the first half $T_3/2$ of said specified prescribed time $T_3$, and conducting the input analog voltage to the second signal input terminal.

7 Claims, 15 Drawing Figures

ANALOG-DIGITAL CONVERTER

BACKGROUND OF THE INVENTION

This invention relates to an analog-digital converter (hereinafter abbreviated as "A-D converter") and more particularly to an A-D converter which can automatically carry out zero adjustment and full-scale adjustment with high precision and attain ratiometric conversion by causing an analog input voltage and reference voltage to have the same polarity, while adapting the dual slope system.

To date, a dual slope type A-D converter has been widely accepted. FIG. 1 shows the principle and circuit arrangement of the prior art A-D converter and FIG. 2 sets forth an operating waveform. Referring to FIG. 1, reference numeral $V_S$ denotes an input voltage being measured; $-V_R$ a reference voltage; $V_C$ a comparison reference voltage; 1 a D.C. amplifier;and 2 an analog comparator. Where an input terminal 3 is impressed with the input voltage $V_S$ for a prescribed time $T_1$ with switch means 4 set in the indicated condition, then an output voltage $V_O$ from the D.C. amplifier 1 decreases from the reference level $V_C$, as shown in FIG. 2. The angle of inclination presented by said decrease is defined by the time constant of an integration circuit, that is, a product arrived at by multiplying the resistance R of an input resistor and the capacitance C of an integration capacitor. Next, the operation of the switch means 4 is changed over to the input terminal 5 to supply an input voltage $-V_R$ to the A-D converter. As the result, the output voltage $V_O$ rises to intersect the reference level $V_C$ in a time $T_2$. The angle of inclination shown by the increased output voltage $V_O$ is also defined by the time constant $C_R$ of the integration circuit. The following relationship is established between the fall and rise of the output voltage $V_O$:

$$V_S T_1 + (-V_R)T_2 + 0$$

Thus $(V_S)/V_R = (T_2/T_1)$. Times $T_1$, $T_2$ are determined by counting clock pulses issued. In this case, the number of clock pulses counted during the time $T_2$ represents the A-D converted value of the input voltage $V_S$.

The conventional dual slope type A-D converter is based on the above-mentioned principle. However, the dual slope system of FIG. 1 is accompanied with two noticeable drawbacks described below.

The first drawback is that where a time difference occurs in the A-D conversion due to the presence of the offset voltage $\Delta V$ of the D.C. amplifier 1, then the following ratio results between the levels of the input voltage $V_S$ and referential voltage $-V_R$.

$$V_S/V_R = (1 - (\Delta V/V_R)T_2/T_1 - \Delta V/V_R,$$

and consequently the ratio $V_S/V_R$ fails to denote the ratio $T_2/T_1$. To eliminate this drawback, various processes have been proposed, for example, the process of manually carrying out the zero adjustment and full-scale adjustment of the offset voltage of the D.C. amplifier 1 or effecting the zero and full-scale adjustments thereof by extracting the offset voltage to overlap it on the input voltage and reference voltage.

The second drawback is that the different polarities of the input voltage and reference voltage present difficulties in effecting ratiometric conversion. This ratiometric conversion can be only attained when the input voltage and reference voltage have the same polarity. With the prior art A-D converter, therefore, it was necessary for said ratiometric conversion to provide a voltage $V_R$ having the same level as the reference voltage $-V_R$ and the opposite polarity thereto. However, it was extremely difficult for forming of voltage of the positive and negative polarities to have exactly the same amplitude. Any difference in the amplitude directly led to errors in the operation of an A-D converter, making it impossible to obtain fully accurate values of ratiometric conversion.

Referring to the above-mentioned two noticeable drawbacks of the prior art A-D conversion, a number of automatic means have been proposed for the zero and full-scale adjustments of the offset of a D.C. amplifier, whereas no satisfactory method has been developed to realize accurate ratiometric conversion.

SUMMARY OF THE INVENTION

This invention has been accomplished in view of the above-mentioned circumstances and is intended to provide an A-D converter wherein the zero and full-scale adjustments of the offset of a D.C. amplifier can be automatically carried out exactly to the required degree of A-D conversion and input and reference voltages are made to have the same polarity, thereby attaining ratiometric conversion.

DETAILED DESCRIPTION OF THE PREFERRED EMBODIMENTS

Figure 1:
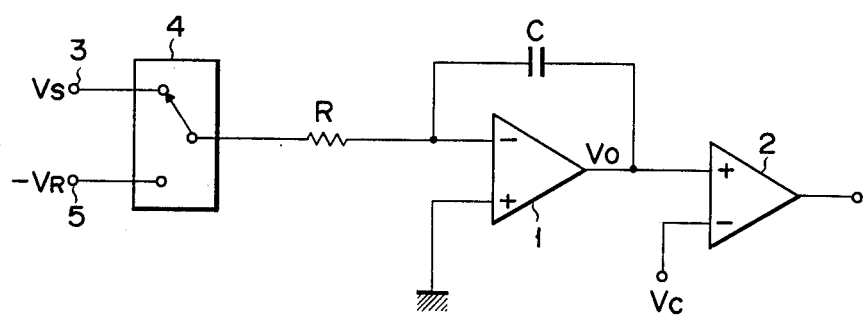
FIG. 1 is a block circuit diagram of a prior art dual slope type A-D converter.
Figure 2:
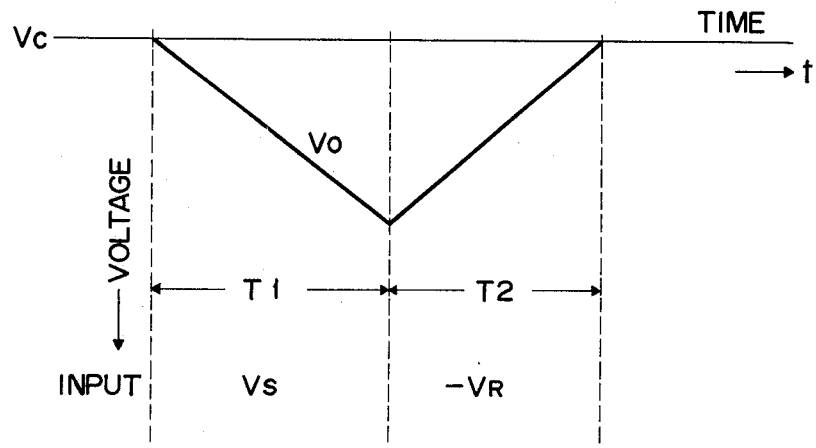
FIG. 2 is a graphic representation illustrating the operation of the A-D converter of FIG. 1.
Figure 3:
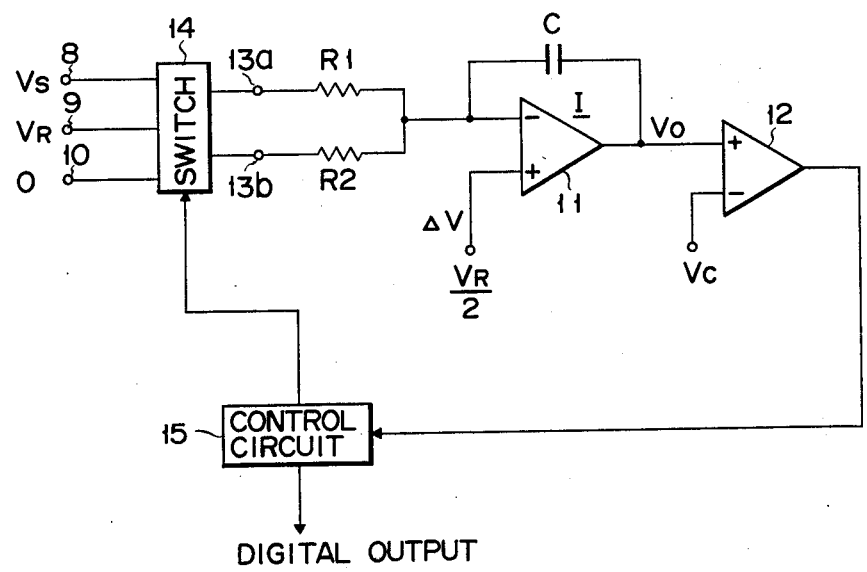
FIG. 3 is a block circuit diagram of an A-D converter according to an embodiment of this invention.

Referring to the embodiment of FIG. 3, input terminals 8, 9, 10 connected to an analog switch 14 are supplied with an input voltage $V_S$, referential voltage $V_R$ and grounding voltage O. An output signal from the analog switch 14 is conducted to an inversion input terminal of a D.C. amplifier 11 constituting an integrator I through two signal input terminals 13a, 13b and two integration resistors $R_1$, $R_2$ having substantially the same value of resistance. As in the embodiment of FIG. 8, the analog switch assembly 14 can deliver any of the three input voltages $V_S$, $V_R$, O to the selected one of the signal input terminals 13a, 13b. The noninversion input terminal of the D.C. amplifier 11 is impressed with a voltage having a level $V_R/2$ equal to half that of the referential voltage $V_R$. The referential voltage input terminal of an analog comparator 12 is supplied with a comparison referential voltage $V_C$. An output signal from the analog comparator 12 is carried to a control circuit 15, which, as later described, controls the operation of the changeover analog switch assembly 14 and also produces a digital output signal according to an analog input voltage.

The analog input voltage $V_S$ and reference voltage $V_R$ have the same polarity. The noninversion input terminal of the D.C. amplifier 11 is supplied with a voltage $V_R/2$. The D.C. amplifier 11 is connected to two integration resistors $R_1$, $R_2$ having the same value of resistance and integration capacitor C collectively to constitute an integrator. Referential numeral 12 denotes an analog comparator; 13a, 13b signal input terminals; and 14 a changeover switch assembly.

Figure 4:
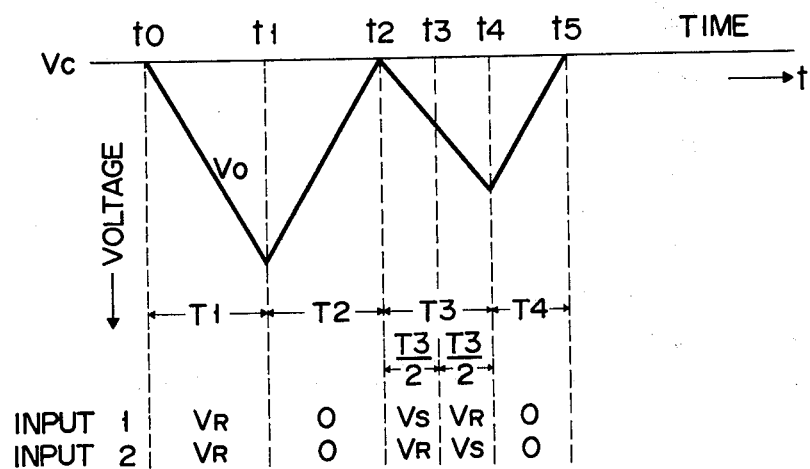
FIGS. 4 and 5 graphically show the operation of the A-D converter of FIG. 3.

There will now be described the operation of an A-D converter embodying this invention, with the input voltage $V_S$ and reference voltage $V_R$ assumed to have a positive polarity alike. The signal input terminals 13a, 13b are supplied with any of $V_S$, $V_R$ and O (grounding voltage) in four ways, as shown in FIGS. 3 and 4, according to the operation of the changeover analog switch assembly 14. In this case, the control circuit 15 first sends forth a changeover control signal to the changeover switch assembly 14 so as to cause the signal input terminals 13a, 13b to be impressed alike with the referential voltage $V_R$. When this condition of impression is continued for a prescribed time $T_1$, an output voltage $V_O$ from the D.C. amplifier 11 decreases, as illustrated by the integration waveform of FIG. 4, during a period from point of point of time $t_0$ to time $t_1$, that is, during said prescribed time $T_1$. Referring to FIG. 4, the output voltage $V_O$ from the D.C. amplifier 11 is shown to begin to be impressed at a point represented by the level of the comparison reference voltage $V_C$ for comparison by the analog comparator 12. In the practical process of impression, however, it is preferred that the supply of said output voltage $V_O$ from the D.C. amplifier 11 be commenced from a point slightly higher level than that of the comparison reference voltage $V_C$ so as to clearly define the point at which the starting point of said output voltage $V_O$ intersects the level of the comparison reference voltage $V_C$. The angle of an inclined line denoting the drop of the output voltage $V_O$ during the prescribed time $T_1$ is determined by a value equal to half the time constant CR of the integrator I. When the reference voltage $V_R$ has continued to be supplied for a prescribed time $T_1$, the movable contacts of the changeover switch assembly 14 have their positions changed, causing the input terminals 13a, 13b to be supplied with a grounding voltage 0. As the result, the output voltage $V_O$ from the D.C. amplifier 11 continues to rise during a period from a point of time $t_1$ to a point of time period $t_2$, that is, during a time $T_2$ and reaches the level of the comparison reference voltage $V_C$. Regarding the periods $T_1$, $T_2$, the following equation results $$\{\frac{1}{2} V_R + \frac{1}{2} V_R - (\frac{1}{2} V_R + \Delta V)\}T_1 + \{-\frac{1}{2} V_R + \Delta V)\}T_2 = O$$

$$(\frac{1}{2} V_R - \Delta V)T_1 = (\frac{1}{2} V_R + \Delta V)T_2$$

Therefore, $T_1$ and $T_2$ have the following relationship:

$$T_2 = \frac{\frac{1}{2} - \frac{\Delta V}{V_R}}{\frac{1}{2} + \frac{\Delta V}{V_R}} \cdot T_1$$

Thus, the offset voltage at the noninversion input terminal of the D.C. amplifier 11 is expressed as $$\Delta V = \frac{\frac{1}{2}(T_1 - T_2)}{T_1 + T_2} \cdot V_R$$

In this case, the relationship between $T_2$ and $T_1$ may be indicated as follows:

$$T_2 = T_1 + \Delta T$$

where:

$\Delta T$ = time difference resulting from $\Delta V$.
Therefore, said time difference $\Delta T$ can be denoted as $$\Delta T = T_2 - T_1$$

In the first stage of operation, two signal input terminals 13a, 13b are supplied with the reference voltage $V_R$ for a prescribed time $T_1$. Later, both input terminals 13a, 13b are grounded, and measurement is made of a time period $T_2$ required for the level of the output voltage $V_O$ to reach that of the comparison reference voltage $V_C$. $\Delta T$ is determined from $T_1$ and $T_2$. This initial stage of operation allows for measurement of an amount of correction required for automatic adjustment. The level of said analog input signal is actually measured in the succeeding stage.

When the level of the output voltage $V_O$ from the D.C. amplifier 11 reaches that of the comparison reference voltage $V_C$ and the comparator 12 gives forth an output signal, then the input terminal 12a is supplied with an input voltage $V_S$ and the input terminal 13b with a reference voltage $V_R$ for a period from a point of time $t_2$ to a point of time $t_3$, that is, for the time period equal to half a period $T_3$ (assuming $O \leq V_S \leq v_R$). As a result, an output voltage $V_O$ from the D.C. amplifier 11 decreases again. In this case, the time $T_3$ is defined in the same manner as the time $T_1$, in accordance with the following equation:

$$T_3 = T_1 - \tfrac{1}{2}\Delta T$$

After the input terminal 13a is impressed with an input voltage $V_S$ and the input terminal 13b with a reference voltage $V_R$ for the first half of the time period $T_3$, the input terminal 13a is conversely supplied with a reference voltage $V_R$ and the input terminal 13b with an input voltage $V_S$ for the second half of the time period $T_3$. Later, both input terminals 13a, 13b are supplied with a grounding voltage 0. Measurement is again made of a time period $T_4$ extending from a point of time $t_4$ to a point of time $t_5$ which is required for the level of the output voltage $V_O$ from the D.C. amplifier 11 to reach that of the comparison reference voltage $V_C$.

The relationship between the time periods $T_3$ and $T_4$ is also expressed by the following equation:

$$\{\frac{1}{2}V_S + \frac{1}{2}V_R - (\frac{1}{2}V_R + \Delta V)\}T_3 + \{-(\frac{1}{2}V_R + \Delta V)\}T_4 = 0 \quad (\frac{1}{2}V_S - \Delta V)T_3 = (\frac{1}{2}V_R + \Delta V)T_4 \quad (1)$$

Therefore, the ratio between the levels of the input voltage $V_S$ and reference voltage $V_R$ may be expressed as follows:

$$\frac{V_S}{V_R} = \frac{T_4}{T_3}(1 + \frac{T_1 - T_2}{T_1 + T_2}) + \frac{T_1 - T_2}{T_1 + T_2}$$

Since $\Delta T = T_2 - T_1$, the above equation may be rewritten as follows:

$$\frac{V_S}{V_R} = \frac{T_4}{T_3} \cdot \frac{T_1}{T_1 + \frac{1}{2}\Delta T} - \frac{\frac{1}{2}\Delta T}{T_1 + \frac{1}{2}\Delta T}$$

Since $T_3 = T_1 - \frac{1}{2}\Delta T$, the above equation may be further changed as follows:

$$\frac{V_S}{V_R} = \frac{T_4}{T_1} \cdot 1 - \frac{1}{(\frac{1}{2}\frac{\Delta T}{T_1})^2} - \frac{1}{2} \cdot \frac{\Delta T}{T_1} \cdot \frac{1}{1 + \frac{1}{2}\frac{\Delta T}{T_1}}$$

Thus the ratio between the levels of $V_S$ and $V_R$ may be approximately determined by the following equation:

$$(\frac{V_S}{V_R})_A = \frac{T_4 - \frac{1}{2}\Delta T}{T_1}$$

where:
$T_1$ = a known period in which a prescribed number of clock pulses are issued
$T_4$ = a time determined by measurement
$\Delta T$ = a value determined by calculating $\Delta T = T_2 - T_1$
$A$ = a suffix denoting approximation Errors resulting from approximation are indicated as follows:

$$(\frac{V_S}{V_R})_A - \frac{V_S}{V_R} = -\frac{1}{4}\{\frac{T_4}{T_1} \cdot \frac{1}{1 - (\frac{\Delta T}{2T_1})^2} + \frac{1}{1 + \frac{\Delta T}{2T_1}}\}(\frac{\Delta T}{T_1})^2$$

Said errors having an infinitely small value proportional to ($\Delta T\, 2/T_1$) do not raise any practical problem. In the first stage of operation of the A-D converter of this invention, two input terminals 13a, 13b are impressed with a reference voltage $V_R$ for a prescribed time period $T_1$. Later, both input terminals 13a, 13b are grounded to determine a time period $T_2$, thereby defining a required amount $\Delta T$ for automatic adjustment. A prescribed time period $T_3$ used in actually measuring the level of an input voltage $V_S$ is determined by the equation:

$$T_3 = T_1 - \frac{1}{2}\Delta T$$

Thereafter, the first input terminal 13a is supplied with an input voltage $V_S$ and the second input terminal 13b with a reference voltage $V_R$ for a time equal to half the time $T_3$ ($T_3/2$) thus determined. During the second half of the time $T_3$ ($T_3/2$), the first input terminal 13a is conversely supplied with a reference voltage $V_R$, and the second input terminal 13b with an input voltage $V_S$. Thereafter, both input terminals are again supplied with a grounding voltage 0 to measure a time period $T_4$.

There will now be described by reference to FIGS. 3 and 5 the second stage of operation of the subject A-D converter, where both input voltage $V_S$ and reference voltage $V_R$ have a positive polarity. In this case, the operation of determining from $T_1$ and $T_2$ a required amount of correction for automatic adjustment of the offset of the D.C. amplifier 11 is carried out in exactly the same manner as in the first stage of operation. Both input terminals 13a, 13b are supplied with a reference voltage $V_R$ and, after a time $T_1$, with a grounding voltage 0. Measurement is made of a time required for the level of an output voltage $V_O$ from the D.C. amplifier 11 to reach that of a comparison reference voltage $V_C$. This operation provides the following equation:

$$T_2 = T_1 + \Delta T$$

Thereafter, the input terminal 13a is impressed with an input voltage $V_S$ and the input terminal 13b with a grounding voltage 0 for a period from a point of time $t_2$ to a point of time $t_3$, that is, for a period equal to half the time period $T_3$ (assuming $0 \leq V_S \leq V_R$). As a result, the level of an output voltage $V_O$ from the D.C. amplifier 11 rises above that of the comparison reference voltage $V_C$ as shown in FIG. 5. In this case, the time period $T_3$ is determined as follows:

$$T_3 = T_1 + \frac{1}{2}\Delta T$$

After the first half of the time $T_3$, the input terminal 13a is supplied with a grounding voltage 0 and the input terminal 13b with an input voltage $V_S$ for a period from a point of time $t_3$ to a point of time $t_4$, that is, for the second half of the time $T_3$. Later, both input terminals 13a, 13b are supplied with a reference voltage $V_R$, measuring a time period $T_4$ required for the level of an output voltage $V_O$ from the D.C. amplifier 11 to reach that of a comparison reference voltage $V_C$. As a result, the following equation is obtained:

$$\{\frac{1}{2}V_S - (\frac{1}{2}V_R + \Delta V)\}T_3 + \{V_R - (\frac{1}{2}V_R + \Delta V)\}T_4 = 0.$$

Since $\Delta T = T_2 - T_1$ and $T_3 = T_1 + \frac{1}{2}\Delta T$, the ratio ($V_2/V_R$) of the levels of the input voltage $V_S$ and reference voltage $V_R$ is indicated as follows:

$$\frac{V_S}{V_R} = -\frac{T_4}{T_1} \cdot \frac{1 + \frac{\Delta T}{2T_1} \cdot \frac{1}{1 + \frac{\Delta T}{2T_1}}}{1 + \frac{\Delta T}{2T_1}} + 1 - \frac{\Delta T}{2T_1} \cdot \frac{1}{1 + \frac{\Delta T}{2T_1}}$$

Namely, the following approximation equation results:

$$(\frac{V_S}{V_R})_A = \frac{(T_1 - T_4) - \frac{1}{2}\Delta T}{T_1} \quad (2)$$

In this case, a time difference is infinitely small as indicated by the following equation:

$$(\frac{V_S}{V_R})_A - \frac{V_S}{V_R} = -\frac{1}{4}\{\frac{T_4}{T_1} \cdot \frac{1}{(1+\frac{\Delta T}{2T_1})^2} + \frac{1}{1+\frac{\Delta T}{2T_1}}\}(\frac{\Delta T}{T_1})^2$$

As apparent from the above approximation equation, the ratio $(V_S/V_R)$ determined by the above-mentioned operation is not derived from the correction of the time period $T_4$, but from the correction of $(T_1 - T_4)$.

In the second stage of operation, the two input terminals 13a, 13b are impressed with a referential voltage $V_R$ for a time $T_1$ and later with a grounding voltage for a time $T_2$ to determine a required time amount of time difference $\Delta T$ for automatic adjustment of the offset of the D.C. amplifier 11. A period $T_3$ during which the input voltage $V_S$ being measured continues to decrease is defined to be $T_3 = T_1 + \frac{1}{2}\Delta T$. The terminal 13a is supplied with an input voltage $V_S$, and the terminal 13b with a grounding voltage 0 during the first half of the period $T_3$ thus determined. During the second half of said period $T_3$, both input terminals 13a, 13b are impressed with a reference voltage $V_R$ to measure a period $T_4$.

The foregoing description refers to the case where both input terminals 13a, 13b were impressed with a reference voltage $V_R$ during a period $T_1$ and later with a grounding voltage 0 during a period $T_2$ to determine a time difference $\Delta T$. However, it also attains the object of this invention conversely to supply both input terminals 13a, 13b with a grounding voltage $V_O$ during the period $T_1$ and with a reference voltage $V_R$ during the period $T_2$.

The A-D converter embodying this invention is a novel form of the dual slope type A-D converter which is characterized in that it comprises two input resistors $R_1$, $R_2$ having nominally the same value of resistance. According to the subject A-D converter, the input and reference voltages $V_S$, $V_R$ having the same polarity are alternately appled to both input terminals 13a, 13b in the first and second stages of operation. In the first stage, both input terminals are impressed with a reference voltage $V_R$ and later with a grounding voltage to determine a required amount of time difference $\Delta T$ for automatic adjustment of the offset of a D.C. amplifier included in the subject A-D converter. In the second stage, an input voltage is impressed on one of the two input terminals 13a, 13b for A-D conversion of the input voltage $V_S$ with the time difference $\Delta T$ taken into account. The input voltage $V_S$ is supplied to the two input terminals 13a, 13b alternately for the same period equal to half the period $T_3$.

Table 1 below collectively presents the manner in which the input and reference voltages $V_S$, $V_R$ having the positive polarity are alternately supplied in four ways to the input terminals 13a, 13b. The numerals I, II, III, IV denote the four patterns of combination in which said input and reference voltages $V_S$, $V_R$ are interchangeably supplied to the input terminals 13a, 13b. The character "input 1" shows a voltage impressed on the input terminal 13a, and the character "input 2" represents a voltage supplied to the input terminal 13b.

Table 1

|     |         | $T_1$ | $T_2$ | $\frac{T_3}{2}$ | $\frac{T_3}{2}$ | $T_4$ |
|-----|---------|-------|-------|-----------------|-----------------|-------|
| I   | Input 1 | $V_R$ | O     | $V_S$           | $V_R$           | O     |
|     | Input 2 | $V_R$ | O     | $V_R$           | $V_S$           | O     |
| II  | Input 1 | $V_R$ | O     | $V_S$           | O               | $V_R$ |
|     | Input 2 | $V_R$ | O     | O               | $V_S$           | $V_R$ |
| III | Input 1 | O     | $V_R$ | $V_S$           | O               | $V_R$ |
|     | Input 2 | O     | $V_R$ | O               | $V_S$           | $V_R$ |
| IV  | Input 1 | O     | $V_R$ | $V_S$           | $V_R$           | O     |
|     | Input 2 | O     | $V_R$ | $V_R$           | $V_S$           | O     |

Table 2 below collectively indicates the values of $\Delta T$, $T_3$ and $(V_S/V_{RA})$ occuring in the above mentioned four ways in which the input and reference voltages $V_S$, $V_R$ are interchangeably supplied to the input terminals 13a, 13b.

Table 2

|     | $\Delta T$ | $T_3$ | $(\frac{V_S}{V_R})_A$ |
|-----|------------|-------|-----------------------|
| I   | $T_2-T_1$  | $T_1 - \frac{\Delta T}{2}$ | $\frac{T_4 - \frac{1}{2}\Delta T}{T_1}$ |
| II  | $T_2-T_1$  | $T_1 + \frac{\Delta T}{2}$ | $\frac{(T_1 - T_4) - \frac{1}{2}\Delta T}{T_1}$ |
| III | $T_2-T_1$  | $T_1 - \frac{\Delta T}{2}$ | $\frac{(T_1 - T_4) + \frac{1}{2}\Delta T}{T_1}$ |
| IV  | $T_2-T_1$  | $T_1 + \frac{\Delta T}{2}$ | $\frac{T_4 + \frac{1}{2}\Delta T}{T_1}$ |

Generally, a digital output from an A-D converter is so designed as to cause the specified level range of an input signal between the maximum and minimum values to correspond to a suitably determined number of digital steps. For example, a binary A-D converter is designed to produce a digital output represented by 000 . . . 00 for a maximum level of an input voltage and by 111 . . . 11 for a maximum level thereof. A number of digital steps lying between the maximum and minimum levels of an input voltage is denoted by $S = (2^m - 1)$, (where $m$ represents the bit number of a digital output from the A-D converter).

With the above-mentioned embodiment, where $V_R$ represents a maximum level of an analog input voltage $V_S$, and O shows a minimum level thereof, and, in the first stage of operation, a period $T_1$ is determined by a counted number S of clock pulses, then a clock pulse count of $(T_4 - \frac{1}{2}\Delta T)$ denotes a corrected required digital output from the A-D converter. Where, in the second stage of operation, a period $T_1$ is determined by a counted S number of clock pulses for the same level range of an input signal, then a counted number $\{(T_1 - T_4) - \frac{1}{2}\Delta T\}$ of clock pulses represents a desired digital output from the A-D converter as seen from the equation (1).

If a maximum level of an input voltage is denoted by $J_{max} V_R$ and a minimum level thereof by $J_{min} V_R$ ($1 > J_{max} > J_{min} > 0$), a desired form of a digital output is obtained from the A-D converter by subtracting a counted S number of clock pulses multiplied by a fraction $J_{min}/(J_{max}-J_{min})$ from a counted number of pulses representing a digital output from the A-D converter with a period $T_1$ denoted by a counted S number of clock pulses multiplied by a fraction $1/(J_{max}-J_{min})$.

The point is that a suitable number of clock pulse is allotted to a period $T_1$ over the specified level range of an input signal, and, if necessary, a proper counted number of clock pulses is subtracted from a number of clock pulses representing a digital output from the A-D converter in order to obtain a required digital output therefrom.

Elevation of the precision with which the periods $T_1$, $T_2$, $T_3$, $T_4$ are measured is necessary to improve the operational accuracy of an A-D converter. Since the length of a period is determined by counting a number of clock pulses allotted thereto, an error as large as at least one count is unavoidable as viewed from the operational precision of the A-D converter. This difficulty can be resolved by multiplying the above-mentioned counted number of clock pulses by an integral number (a preferred multiplier being any of multiples of 2 such as 2, 4, 8, etc.) in measuring a length of time and dividing a counted number of clock pulses representing a digital output from the A-D converter which is thus multiplied by the same integral number as that used as a multiplier.

Figure 6:
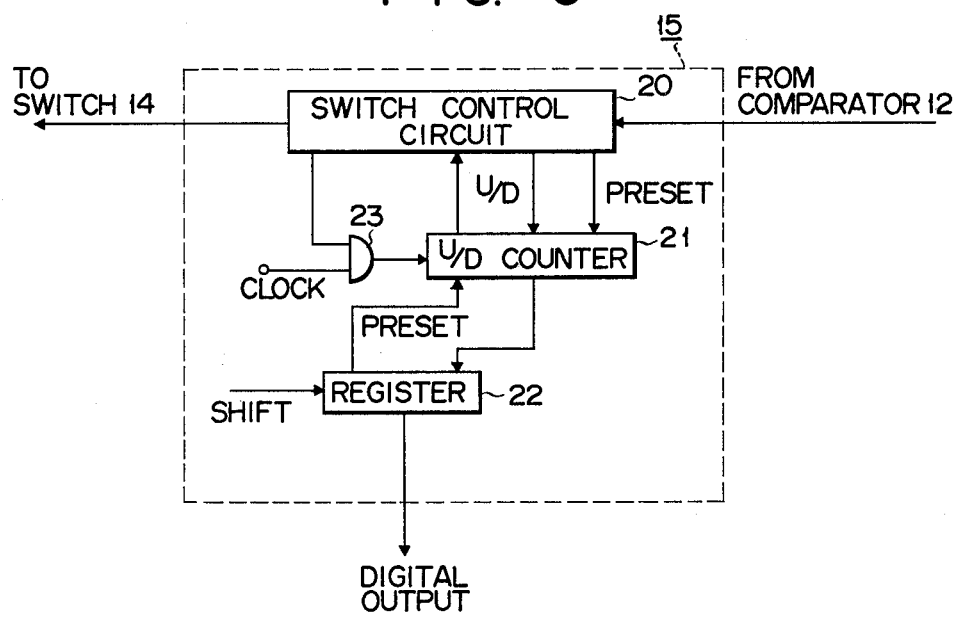
FIG. 6 is a block circuit diagram of a control circuit included in FIG. 3.
Figure 7:
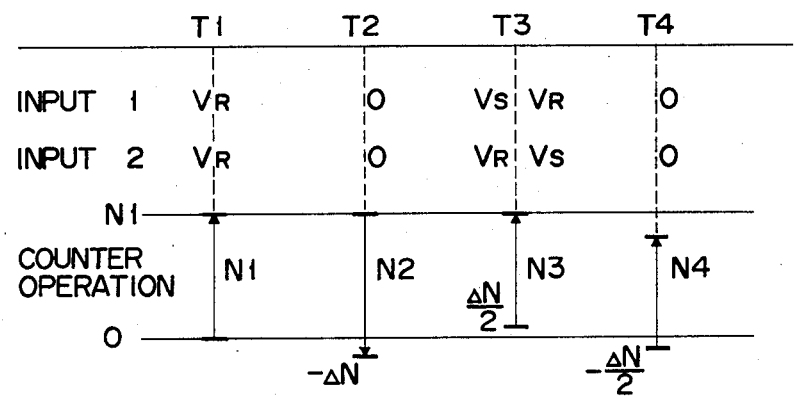
FIG. 7 indicates the operating condition of a counter included in FIG. 6.

FIG. 6 illustrates a block circuit diagram of the control circuit 15 of this invention used to obtain a corrected digital output. FIG. 7 shows the operation of an updown counter 21 of FIG. 6. Referring to FIG. 6, numeral 20 denotes a switch control circuit, which controls the operation of the changeover switch 14 according to the level of an output voltage from the comparator 12, the preset of the updown counter 21 and up- and down-counting. Shift register 22 which is stored with a count made by the counter 21, applies a prescribed operation to said stored count, sends a count thus treated back to the counter 21 and produces an A-D converted value of an input signal.

There will now be described by reference to FIG. 7 the function of said switch control circuit 15 in the aforesaid first stage of operation.

When both input terminals 13a, 13b are impressed with a reference voltage $V_R$, the updown counter 21 is preset at zero to count a number of clock pulses supplied to said counter 21 through an AND gate 23 (FIG. 6) up to a prescribed number $N_1$. This interval denotes a period $T_1$. When counting clock pulses up to a predetermined number, the updown counter 21 gives forth a signal to the switch control circuit 20, thereby causing the changeover switch 14 to be so operated as to impress both input terminals 13a, 13b with a grounding voltage. At this time, the updown counter 21 is changed to down counting successively to count down said prescribed number $N_1$ until the comparator 12 sends forth an output voltage to said updown counter 21. This interval denotes a period $T_2$. With a downcounted number designated as $N_2$, the information stored in said updown counter 21 is indicated as $N_1 - N_2 = -\Delta N$. Said $-\Delta N$ represents a time difference $\Delta T$. A signal showing $-\Delta N$ is transferred to the shift register 22, where the signal is shifted down by one bit to have its negative prefixed rotation to the positive to be returned to the updown counter 21, namely, to preset the updown counter 21 at $\Delta N/2$. At this time, input and reference voltages $V_S$, $V_R$ are alternately supplied to the input terminals 13a, 13b, and the updown counter 21 continues counting, until the prescribed number $N_1$ is reached, namely, counts up to an extent of $N_1 - \Delta N/2 = N_3$. This count denotes a period $T_3$. When the updown counter 21 counts up to the prescribed number $N_1$, the voltages supplied to the input terminals 13a, 13b are interchanged. The updown counter 21 is preset at $-\Delta N/2$, and continues counting until the comparator 12 supplies an output voltage to said updown counter 21, that is, until a prescribed number $N_4$ is reached. This interval corresponds to a period $T_4$. The information $(N_4 - \Delta N/2)$ stored in the updown counter 21 at this time is transferred to the shift register 22, which in turn gives forth said stored number.

The output value $(N_4 - \Delta N/2)$ from the shift register 22 denotes a value of the ratio $(V_S/V_{RA})$.

The foregoing description refers to the function of the switch control circuit 15 in the first stage of operation. All the forms of operation shown in the previous Table 2 can be carried out in the same manner.

As described above, the embodiment of this invention can attain the automatic adjustment of the offset of the D.C. amplifier 11 and admits of application of input and reference voltages having the same polarity, thus enabling ratiometric conversion to be easily effected. If the D.C. amplifier and comparator are thus operated with the same polarity, then the A-D converter as a whole can function with a single polarity, prominently simplifying the arrangement of a power source device. The A-D converter of the invention can correct errors occurring from the offset of the integration circuit I as a whole, including the offset of an input voltage appearing in D.C. amplifier, and errors resulting from any slight displacement of the level of a voltage impressed on the noninversion input terminal of the D.C. amplifier from a prescribed level of voltage (a level lying intermediate between the levels of the reference and grounding voltages).

Further, with the embodiment of this invention, a period $T_3$ during which the level of an input voltage is actually measured is divided into two equal parts. Namely, the voltages impressed on the two input resistors $R_1$, $R_2$ are interchanged during the first and second halves of said period $T_3$. Accordingly, even if the input resistors deteriorate with time or changes occur in ambient temperature, the resultant errors can be offset to zero, providing an accurate amount of A-D conversion.

The process of impressing interchangeable voltages to the input resistors during the first and second halves of the period $T_3$ has such advantage that even if the two input resistors do not have a fully equal value of resistance, they can realize practically the same effect. The requisite condition is that an equivalent input voltage supplied to the integration circuit I during the period $T_3$ be chosen to have a level equal to the mean of the levels of the input and reference voltages $V_S$, $V_R$ impressed on the two input terminals 13a, 13b.

The above-mentioned requisite condition is now explained in the form of a numerical equation. Where the resistance of the two input resistors are denoted by $R(1+\alpha)$ and $R(1-\alpha)$ respectively, and the first and second halves of the period $T_3$ are represented by $T_3(1+\delta)/2$ and $T_3(1-\delta)/2$ respectively with a time difference taken into account, then the level of an equivalent input voltage supplied to the integration circuit I may be expressed by the following equation, because the two input terminals 13a, 13b are impressed with interchangeable voltages as shown in the combination patterns I, IV:

$$\frac{1}{T_3} \{(V_S \frac{1-\alpha}{2} + V_R \frac{1+\alpha}{2}) \frac{T_3(1+\delta)}{2} +$$
$$(V_S \frac{1+\alpha}{2} + V_R \frac{1-\alpha}{2}) \frac{T_3(1-\delta)}{2}\} =$$
$$V_S \frac{1-\alpha\delta}{2} + V_R \frac{1+\alpha\delta}{2}$$

In the combination patterns II, III, where the two input terminals 13a, 13b are supplied with input and grounding voltages $V_S$, O, the level of an equivalent voltage on the integration circuit I is indicated as
$$V_S(1-\alpha\delta)/2$$

In a theoretically ideal case, the coefficient by which the period $T_3$ is divided into 2 parts is ½. Therefore, a time difference error can be expressed as $\alpha\delta$.

Conversely where various forms of voltage are not interchangeably supplied to the two input resistors during the first and second halves of the period $T_3$, then a difference between the values of resistance of said two input resistors appears unchanged. Said difference is expressed as $\alpha$.

However, an attempt to provide such a combination of two input resistors having said resistance difference $\alpha$ of zero would involve high cost. Moreover, it would be extremely difficult to realize $\alpha=0$ regardless of change in ambient temperature and the deterioration with time of said resistors.

On the other hand, where various forms of voltage are interchangeably supplied to the two input resistors during the first and second halves of the period $T_3$ as is carried out in the embodiment of this invention, the time difference is indicated by $\alpha\delta$. If, therefore, said period $T_3$ is divided into two fully equal parts, then there result $\delta=0$ and $\alpha\delta=0$, easily eliminating the above-mentioned problems.

For practical purpose, it is advised to define a time difference so as to attain the required operational precision of the A-D converter. Where the same amount of time difference is utilized, this invention offers a far greater advantage in realizing said precision than the prior art A-D converter wherein input and reference voltages are not alternately supplied to the input resistors. For example, where a given A-D converter is demanded to have an error of 0.01% at most, a difference $\alpha$ between the values of resistance of the two input resistors should be of the order of 0.0001, if input and reference voltages are not alternately supplied to said resistors. In contrast, where the input and reference voltages are alternately supplied to the two input resistors, then $\alpha\delta$ is only desired to have a value of, for example, 0.0001. This can be easily realized by a combination of $\alpha=0.01$ and $\alpha=0.01$.

As apparent from the aforesaid Table 2, all the values shown in the columns of $T_3$ and $(V_S/V_R)_A$ contain a term $\Delta T/2$. If $\Delta T$ denotes an odd number, then there will appear a function of 0.5 in the form of $\Delta T/2$. This fraction should be discorded or reckoned as a unit.

Where, therefore, as in the combination patterns I, IV, values given in the columns of $T_3$ and $(V_S/V_R)_A$ have the correction term $\Delta T/2$ prefixed with the same notation, then one of the values of said two correction terms $\Delta T/2$ should be discarded and the other should be reckoned as a unit. Then the errors of the A-D converter can be decreased. On the other hand, where, as in the combination patterns II, III, values shown in the columns of $T_3$ and $(V_S/V_R)_A$ have the correction term $\Delta T/2$ prefixed with different notations, then the value of each correction term $\Delta T/2$ should advisably be discarded or reckoned as a unit in order to reduce the errors of the A-D converter.

As previously mentioned, input, reference and grounding voltages are impressed on the input terminals 13a, 13b through the changeover switch assembly 14. This switch assembly 14 is generally of an electronic type. However, the response time of said switch assembly 14 is extremely short, but not zero. Moreover, a plurality of unit switches constituting said switch assembly 14 give different response times. Therefore, a time difference possibly takes place while voltages are interchangeably supplied to the input terminals 13a, 13b during the period $T_3$. To eliminate the occurrence of said time difference, it is advised to carry out the interchangeable supply of voltages to the input terminals 13a, 13a also during the time $T_1$. Normally during the period $T_1$, both input terminals 13a, 13b are supplied with a reference voltage $V_R$ or a grounding voltage 0. If the interchangeable supply of voltages is additionally carried out during the period $T_1$ in the same manner as during the period $T_3$ purposely to introduce a time difference arising from said interchangeable supply, then a time difference caused by the interchangeable impression of voltages can be offset.

In the foregoing embodiment, the input terminals 13a, 13b were supplied with three forms of voltage, that is, input voltage, reference voltage and grounding voltage. However, the grounding voltage need not be used as such, because the grounding voltage may be deemed as a kind of reference voltage. In other words, the input terminals 13a, 13b of the A-D converter according to the embodiment of this invention may be considered to be supplied with an analog input voltage being measured and first and second reference voltages having the same polarity as the analog input voltage but different levels from each other. A voltage impressed on the noninversion input terminal of the D.C. amplifier 11 is chosen to have a level substantially intermediate between those of the first and second reference voltages, that is, a value of $\frac{1}{2}(VR_1+VR_2)$.

The foregoing description refers to the case where the first and second reference voltages had a positive polarity (or one of said reference voltages had a zero level, but is also applicable to the case where the first and second reference voltages have a negative polarity, or one of said referential voltages had a zero level). In the latter case, the noninversion input terminal of the D.C. amplifier 11 is impressed with a negative voltage.

In the foregoing embodiment, a single reversible counter 21 was used in presetting and measuring the length of a period during which clock pulses were counted. However, a plurality of counters may be provided to measure the periods $T_1$, $T_2$, $T_3/2$, $T_4$ separately. Or it is possible to measure the periods $T_1$, $T_2$ by one counter and the periods $T_3/2$, $T_4$ by another counter. Thus, the number of counters may be suitably selected.

The above-mentioned process consisted in eliminating the offset voltage of the D.C. amplifier 11 in a single correction cycle on the basis of a value of an approximation equation, with the period $T_1$ set at a fixed value. Where, however, a corrected integrated period $T_3$ is used as the succeeding period $T_1$ being measured, then a period required for the input voltage $V_S$ to be integrated in actual measurement can be determined with high accuracy. Further with the A-D converter of this invention, the period $T_3$ is divided into substantially equal parts, and input and reference voltages $V_S$, $V_R$ are alternately supplied to the two input resistors $R_1$, $R_2$ during the first and second halves of said period $T_3$, thereby eliminating an effect resulting from a difference between the values of resistance of said two input resistors $R_1$, $R_2$. When the above-mentioned correction operation is repeated, errors of the A-D converter caused by the offset voltage of the D.C. amplifier 11 can be gradually reduced, attaining the more accurate measurement of the level of an input voltage $V_S$ and in consequence a more precise value of A-D conversion.

There will now be described the principle on which the above-mentioned correction process is based. With the periods $T_1$, $T_2$ corrected for the n-order time designated as $T_1^{(n)}$, $T_2^{(n)}$, and the periods $T_3$, $T_4$ actually measured similarly for the n-order time as $T_3^{(n)}$, $T_4^{(n)}$, there results the following equation:

$$T_3^{(n)} = T_1^{(n+1)}$$

With the aforesaid equation (1) applied in this case, the following equation is derived:

$$(V_S - 2\Delta V)T_3^{(n)} = (V_R + 2\Delta V)T_4^{(n)}$$

With the term $2\Delta V$ substituted by $\Delta V$, there is obtained the following equation:

$$\frac{V_S}{V_R} = (1 - \frac{\Delta V}{V_R})\frac{T_4^{(n)}}{T_3^{(n)}} - \frac{\Delta V}{V_R} \quad (3)$$

Assuming the following equation:

$$\frac{1 - \frac{\Delta V}{V_R}}{T_3^{(n)}} = \frac{1}{T_R} \quad (4)$$

$$\frac{V_S}{V_R} = \frac{T_4^{(n)}}{T_R} - \frac{\Delta V}{V_R}$$

is obtained. Further, as the following equation $$\frac{\Delta V}{V_R} = 1 - \frac{T_3^{(n)}}{T_R}$$

can be obtained from the equation (4), $$\frac{V_S}{V_R} = \frac{T_4^{(n)} + T_3^{(n)} - T_R}{T_R}$$

is established.

$T_R$ in the above equation (4) denotes a length of time corresponding to the reference voltage $V_R$, namely, a length of time representing the A-D converted value of said reference voltage $V_R$. Counting of $T_4^{(n)} + T_3^{(n)} - T_R$ corresponding to the input voltage $V_R$ provides an A-D converted output voltage of the input voltage $V_S$. If, therefore, $T_1^{(n)}$ is corrected to determine $T_3^{(n)}$ so as to establish the above equation (3), then the intended result is attained.

The equation (3) is expressed in the form of an actually measured value. If the equation (3) is applied to a correcting period by assuming $V_S = V_R$, the following equation results:

$$1 = (1 - \frac{\Delta V}{V_R})\frac{T_2^{(n)}}{T_1^{(n)}} - \frac{\Delta V}{V_R}$$

Thus, $$\frac{\Delta V}{V_R} = \frac{T_2^{(n)} - T_1^{(n)}}{T_1^{(n)} + T_2^{(n)}}$$

To establish the aforesaid equation (4), therefore, the following equation has only to be satisfied.

$$T_3^{(n)} = (1 - \frac{\Delta V}{V_R})T_R \quad (5)$$

$$= \frac{2T_2^{(n)}T_R}{T_1^{(n)} + T_2^{(n)}}$$

$$= T_1^{(n)} + \frac{T_1^{(n)}}{T_1^{(n)} + T_2^{(n)}}(2T_R - T_1^{(n)} - T_2^{(n)})$$

Since $\Delta V/V_R \approx 1$ is generally accepted in the above equation (4), the primary approximation equation is expressed as follows:

$$\frac{T_1^{(n)}}{T_1^{(n)} + T_2^{(n)}} = \frac{1}{2}$$

Therefore, the following equation $$T_3^{(n)} = T_1^{(n)} + \frac{1}{2}(2T_R - T_1^{(n)} - T_2^{(n)}) \quad (6)$$

will be a proper approximation correction equation to establish the above equation (4). As seen from the equations (5) and (6), errors caused by $\Delta V$ are reduced to zero in case of $2T_R = T_1^{(n)} + T_2^{(n)}$, resulting in $T_3^{(n)} = T_1^{(n)}$.

There will now be described the manner in which errors of the A-D converter can be progressively absorbed, as the number $n$ of repeated corrections increases.

Values obtainable from actual measurement are $T_4^{(n)}$ and $T_3^{(n)}$. A difference between these measured values and a truthful value of $V_S/V_R$ is expressed as follows:

$$\frac{T_4^{(n)} + T_3^{(n)} - T_R}{T_R} - \frac{V_S}{V_R} \quad (7)$$

Now substituting the above equation (6) and the following equation:

$$\frac{T_4^{(n)}}{T_3^{(n)}} = \frac{V_S + \Delta V}{V_R - \Delta V}, \frac{T_2^{(n)}}{T_1^{(n)}} = \frac{V_R + \Delta V}{V_R - \Delta V}$$

then, the above equation (7) may be modified as follows:

$$V_{error}^{(n)} = \frac{\Delta V}{V_R} \cdot \frac{V_R + V_S}{V_R - \Delta V} \cdot (1 - \frac{V_R}{V_R - \Delta V} \cdot \frac{T_1^{(n)}}{T_R}) \quad (8)$$

Therefore, $$V_{error}^{(n+1)} = \frac{\Delta V}{V_R} \cdot \frac{V_R + V_S}{V_R - \Delta V} (1 - \frac{V_R}{V_R - \Delta V} \cdot \frac{T_1^{(n+1)}}{T_R})$$

$$T_1^{(n+1)} = T_3^{(n)} = T_1^{(n)} + \frac{1}{2}(2T_R - T_1^{(n)} - T_2^{(n)})$$

Thus, the following equation results:

$$V_{error}^{(n+1)} = -\frac{\Delta V}{V_R} \cdot \frac{V_R + V_S}{V_R - \Delta V} \cdot \frac{\Delta V}{V_R - \Delta V} \cdot$$
$$(1 - \frac{V_R}{V_R - \Delta V} \cdot \frac{T_1^{(n)}}{T_R})$$
$$= \frac{\Delta V}{V_R - \Delta V} \cdot V_{error}^{(n)}$$

Since $$\left|\frac{\Delta V}{V_R - \Delta V}\right| < 1$$

is generally accepted, there results the following:

$$\left|\frac{V_{error}^{(n)}}{V_{error}^{(n+1)}}\right| < 1$$

Therefore, it is seen that errors of the A-D converter linearly decrease, that is, said errors are progressively reduced and finally absorbed to a zero point as the time n of repeated corrections increases.

As apparent from the foregoing description, repeated corrections elevate the accuracy of a value of A-D conversion. The equation (6) shows that if the equation $2T_R = T_1^{(n)} + T_2^{(n)}$ is satisfied, it will be unnecessary to correct the period $T_3$. It is, therefore, advised to detect a difference between $T_1 + T_2$ and $2T_R$ and carry out correction so as to cause said difference to approach zero. The above-mentioned process of determining the period $T_3$ to be $T_1 - \frac{1}{2}\Delta T$ from a time difference $\Delta T$ resulting from $\Delta V$ is generally accepted. However, $T_3$ may also be determined through the process of measuring $(T_1 + T_2) - 2T_R$, increasing $T_1$ by counting up one clock pulse, in case said term $(T_1 + T_2) - 2T_R$ has a negative value, and decreasing $T_1$ by counting down by one clock pulse in case said term has a positive value.

Figure 8:
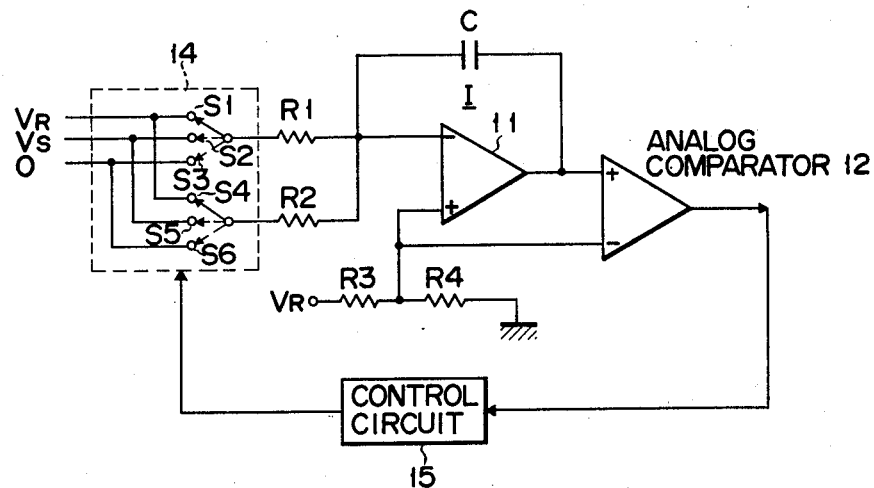
FIG. 8 is a block circuit diagram of an A-D converter according to another embodiment of the invention.

With an A-D converter according to a second embodiment of this invention shown in FIG. 8, reference voltages $V_R/2$ obtained through two resistors $R_3$, $R_4$ having substantially the same value of resistance are supplied to the noninversion input terminal of the D.C. amplifier 11 and the reference voltage input terminal of the analog comparator 12 respectively. Upon receipt of an output signal from the analog comparator 12, the switch control circuit 15 controls the changeover operation of the analog changeover switch assembly 14.

Figure 9:
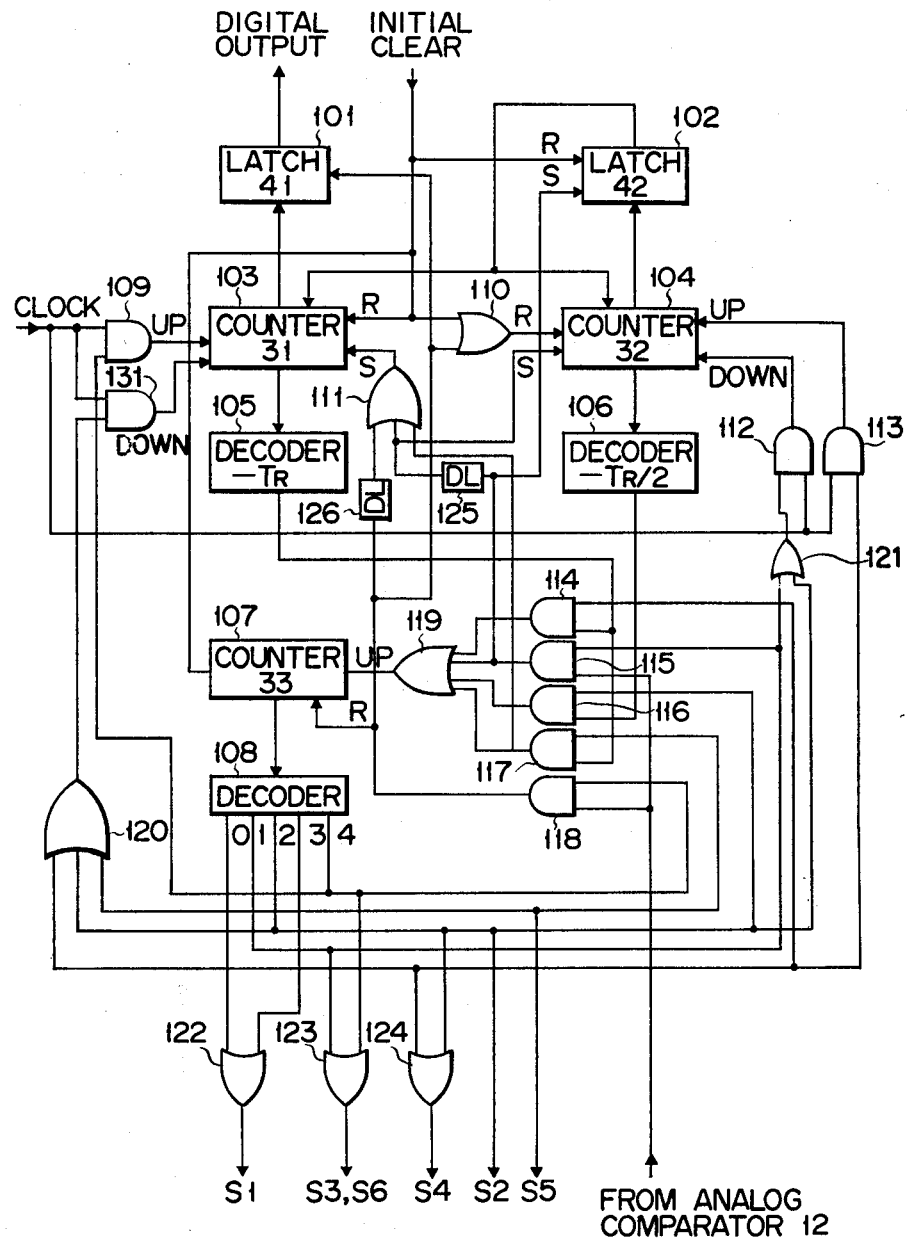
FIG. 9 is a block circuit diagram of a control circuit used with the embodiment of FIG. 8.

There will now be described by reference to FIG. 9 the arrangement and operation of a switch control circuit 15 used with the embodiment of FIG. 8. First, counters 31, 32, 33 and latch 42 are cleared by an initial clear signal. At this time, the counter 33 is brought to a state of zero, and an AND circuit 131 is opened through an OR circuit 120, causing a down clock signal to be introduced into the counter 31 for its down counting. A switch S1 is rendered conducting through an OR circuit 122 to supply a reference voltage $V_R$ to the input terminals of resistors $R_1$, $R_2$. This represents the condition of the column $T_1$ of the combination pattern I shown in the aforesaid Table 1. The above-mentioned zero state of the counter 33 causes an AND gate 113 to be opened and in consequence the counter 32 to be supplied with an up clock signal for its up counting.

When the information stored in the counter 31 is delivered to a $-T_R$ element indicating a length of time corresponding to the A-D converted value of a reference voltage $V_R$, an output signal from a decoder 105 is carried through an AND circuit 114 and OR circuit 119 to the counter 33, which in turn counts up one clock pulse, and is brought to a state of 1. As the result, switches S3, S6 are rendered conducting through an OR circuit 123, and the resistors R1, R2 are impressed with zero voltage, bringing about the condition of the column $T_2$ of the combination pattern I shown in Table 1. When the AND gate 112 is opened through the OR gate 121 a downcounting command is applied to the updown counter 32 which in turn counts down clock pulses. When the integration circuit I produces an output whose voltage level is raised, and the analog comparator 12 generates an output having a logical value of "1", then an AND gate 115 also gives forth an output having a logical value of "1". This output is conducted through an OR circuit 119 to the updown counter 33 which in turn counts up one clock pulse. As a result, a count stored in the updown counter 33 indicates a numeral 2. An output from the AND gate 115 is delivered as a set pulse to the latch 42, which in turn is stored with the data of the updown counter 32, that is, a value of $(T_1 - T_2)$. An output from the AND circuit 115 is delayed by a delay line 125 and the delayed output is delivered as a set pulse to the updown counter 31. A length of delay effected by the delay line 125 is chosen to be sufficient for the latch 42 to be set. An output from the latch 42 is supplied to the data input terminal of the updown counter 31 in the form shifted down by one bit, though not shown. At this time, the updown counter 31 is preset at a value of $(T_1 - T_2)/2$. An output from the delay line 125 is supplied as a set pulse to the updown counter 32. An output from the latch 42 is delivered to the data input terminal of the counter 32 in the form shifted down by two bits. Therefore, the updown counter 32 is preset at a value of $(T_1 - T_2)/4$.

An output from the decoder 108 which represents a numeral 2 actuates the switch S2 and also the switch S4 through an OR circuit 124. As a result, an input signal is successively supplied to the integration circuit I in the combined form shown in the first $T_3/2$ column of the combination pattern I of Table 1. An output representing the numeral 2 from the decoder 108 also passes through an OR circuit 130 to the AND circuit 131 to supply a down clock to the updown counter 31. Further, when the 2 output from the decoder 108 is applied through OR circuit 121 to the AND gate circuit 112, the updown counter 32 is also supplied with a down clock.

When a count stored in the updown counter 32 indicates $-T_R/2$, a decoder 106 produces an output which is conducted through an AND circuit 116 and OR circuit 119 to the updown counter 33 which in turn counts up one clock pulse. Thus, a count stored in said counter 33 at this time shows a numeral 3. A length of time T which passes up to the point at which said numeral 3 is indicated after voltages are supplied to the integration circuit I in the form combined at this time is expressed as follows:

$$\frac{T_1 - T_2}{4} - T = \frac{-T_R}{2}$$

Therefore, the following equation results:

$$T = \frac{1}{2}(T_R + \frac{T_1 - T_2}{2}) = \frac{T_3}{2}$$

An output from the decoder 108 which shows a numeral 3 is transmitted through an OR circuit 122 to the switch S1 for its actuation, causing the resistor R1 to be impressed with a reference voltage $V_R$. Said output is also delivered to the switch S5 for actuation, causing the resistor $R_2$ to be supplied with an input voltage $V_S$. Namely, there results the condition of the second $T_3/2$ term of the combination pattern I shown in Table 1. Since, under this condition, the OR circuit 130 generates an output having a logical value of "1", the updown counter 31 continues down-counting until a length of time denoted by $-T_R$ is reached. A length of time T which lies between the initial point of the period $T_3$ and the point of time at which said $T_R$ is reached is expressed as $$\frac{T_1 - T_2}{2} - T = -T_R$$

Therefore, the following equation results:

$$T = T_R + \frac{T_1 - T_2}{2} = T_3$$

An output from a decoder 105 passes through an AND circuit 117 and OR circuit 119 to the updown counter 33 which in turn counts up one clock pulse to bring its stored count to a numeral 4. An output from said updown counter 33 which denotes the numeral 4 is transmitted through an OR circuit 123 to the switches 3, 6 for actuation, thereby causing the integration circuit I to be supplied with an input of zero volt, namely, bringing about the condition of the term $T_4$ of the combination pattern I shon in Table 1. An output from the AND circuit 117 is conducted as a set pulse to the updown counter 31 through the OR circuit 111, causing the updown counter 31 to be set at the count stored in the latch 42. An output from said updown counter 31 which represents the numeral 4 is carried through an AND circuit 120 to the AND circuit 109 to open its gate, thereby supplying an upcounting command to the updown counter 31, which in turn commences upcounting. When the analog comparator 12 produces an output having a logical value of "1", then the AND circuit 118 also generates an output having a logical value of "1", causing the updown counters 33, 32 to be reset and also the latch 41 to be set at the count stored in the updown counter 31. The count A at which the updown counter 31 is set at this time is expressed as follows:

$$A = \frac{T_1 - T_2}{2} + T_4$$

Thus, the above-mentioned operation cycle of the A-D conversion is brought to an end.

An output from the AND circuit 118 is delayed by a delay line 126. This delayed output is delivered as a set pulse to the updown counter 31, which in turn is set at a value eqaul to half a count stored in the latch 42, namely, at $(T_1 - T_2)/2$. At this time, as a count stored in the updown counter 33 is brought to zero, the aforesaid operation cycle may be successively commenced again. In this case, a series of operation sequence of the periods $T_1$, $T_2$, $T_3$, $T_4$ is again repeated.

However, a count stored in the latch 42 approaches, as previously described, the following value:

$$T_1 + T_2 = 2T_R,$$

each time the above-mentioned measurement is repeated. The process of repeating the measurement of only the periods $T_1$, $T_2$ and carrying out the A-D conversion of the periods $T_3$, $T_4$ only upon receipt of a command for said conversion from the outside can obviously be effected simply by controlling the up-counting and resetting of the updown counter 33 in a slightly modified manner.

Figure 5:
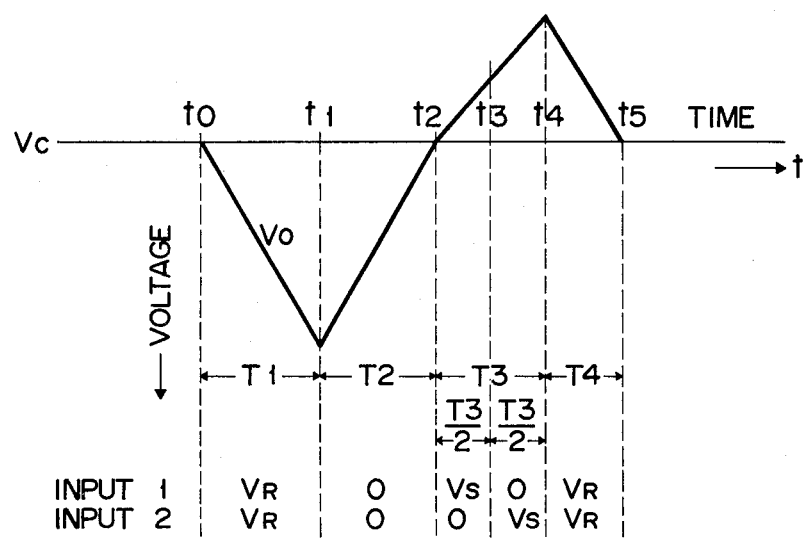

The process of compensating for a difference between the values of resistance of the two integration resistors $R_1$, $R_2$ which was applied in the embodiment shown in FIGS. 3, 4 and 5 collectively was to divide the period $T_3$ in two substantially equal parts, that is, the first and second half-$T_3$ periods, and supply an analog input voltage $V_S$ and reference voltage $V_R$ interchangeably to the two resistors $R_1$, $R_2$ during said two half-$T_3$ periods. However, this compensation process may be effected by the following modified method, which will now be described by reference to FIGS. 3, 10, 11, 12, 13, 14 and 15.

This modified compensation method also attains ratiometric conversion even when a single input resistor is used. Namely, in FIG. 14, the two input resistors $R_1$, $R_2$ of FIG. 3 are replaced by a single resistor R. In this case, voltages are interchangeably supplied to the input terminal 13 in four combination patterns I, II, III, IV shown in Table 3 below.

Table 3

|     | $T_1$ | $T_2$ | $\frac{T_3}{2}$ | $\frac{T_3}{2}$ | $T_4$ |
|-----|-------|-------|-----------------|-----------------|-------|
| I   | $V_R$ | 0     | $V_R$           | $V_S$           | 0     |
| II  | $V_R$ | 0     | 0               | $V_S$           | $V_R$ |
| III | 0     | $V_R$ | 0               | $V_S$           | $V_R$ |
| IV  | 0     | $V_R$ | $V_R$           | $V_S$           | 0     |

A required amount of correction for automatic adjustment of the offset voltage of the D.C. amplifier 11 is determined by supplying the input terminal 13 first with a reference voltage $V_R$ and then a grounding voltage 0 for measurement of $T_2$.

The period $T_1$ is changed by said required amount of correction to define the period $T_3$. The input terminal 13 is impressed with a reference voltage $V_R$ during the first half-$T_3$ period and then with an input voltage $V_S$ during the second half-$T_3$ period. Thereafter, the input terminal 13 is supplied with a grounding voltage 0 to measure the period $T_4$. The switch control circuit 15 of FIG. 14 having substantially the same arrangement as in FIG. 9 can be easily operated simply by supplying different combinations of outputs from the decoder 108 to the changeover switch assembly 14. The A-D converter of FIG. 14 comprises a single input resistor R, eliminating the necessity of considering a difference between the values of resistance of the two input resistors $R_1$, $R_2$ as is the case with FIG. 3. However, it is indispensable to divide the period $T_3$ in two accurately equal parts.

Figure 10:
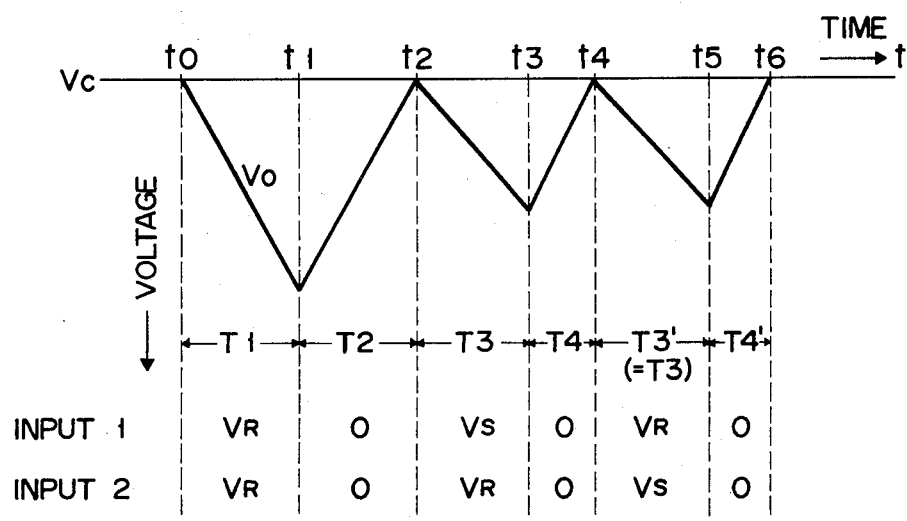
FIGS. 10 and 11 are graphic representations illustrating the operation of an A-D converter using the control circuit of FIG. 12.

When the period $T_4$ required for the analog comparator 12 of FIG. 3 to give forth an output is fully measured, the operation of the changeover switch assembly 14 is shifted to supply the input terminal 13a with a reference voltage $V_R$ and the input terminal 13b with an input voltage $V_S$ for a period $T_3'$ shown in FIG. 10 extending from a point of time t4 to a point of time t5. The period $T_3'$ is defined to be $T_1 - \frac{1}{2}\Delta T$ as in the previous case.

After passage of the period $T_3'$, the input terminals 13a, 13b are impressed with a grounding voltage 0 instead of an input voltage $V_S$ to measure a period $T_4'$ extending from a point of time t5 to a point of time t6 which is required for the level of the resultant voltage to reach the level of a comparison reference voltage $V_C$.

The determined relationship existing between the periods $T_3$, $T_4$ is applicable in the same way to the periods $T_3'$, $T_4'$. The approximation equation denoting the ratio between the levels of the input voltage $V_S$ and reference voltage $V_R$ determined by the above-mentioned process of measuring the periods $T_3'$, $T_4'$ is expressed as $$\left(\frac{V_S}{V_R}\right)'_A = \frac{T_4' - \frac{1}{2}\Delta T}{T_1}$$

When a mean is determined between a value of A-D conversion obtained by supplying, for example, an input voltage $V_S$ to the input terminal 13a and a reference voltage $V_R$ to the input terminal 13b and another value of A-D conversion determined by reversing the above-mentioned process, then errors of an A-D converter arising from the deterioration with time of the input resistors and variation in ambient temperature can be fully corrected.

As mentioned above, the two input terminals 13a, 13b are impressed with a reference voltage $V_R$ for a prescribed period $T_1$ in the first operation. Thereafter, a length of a period $T_2$ is measured by grounding both input terminals 13a, 13b so as to define a required amount of a time difference $\Delta T$ for automatic adjustment of the offset voltage of the D.C. amplifier 11, thereby determining a prescribed period $T_3$ used in actual measurement of the level of an input voltage $V_S$ to be $T_1 - \frac{1}{2}\Delta T$. The input terminals 13a, 13b are impressed with an input voltage $V_S$ and reference voltage $V_R$ for a period $T_3$ thus determined. Thereafter a grounding voltage 0 is supplied to the input terminals 13a, 13b to measure a period $T_4$. Thereafter the input voltage $V_S$ and reference voltage $V_R$ supplied to the input terminals 13a, 13b are exchanged for each other to measure a period $T_4'$. A digital value of the input voltage $V_S$ is determined from an average between the measured values of the lengths of the periods $T_4$, $T_4'$.

Figure 11:
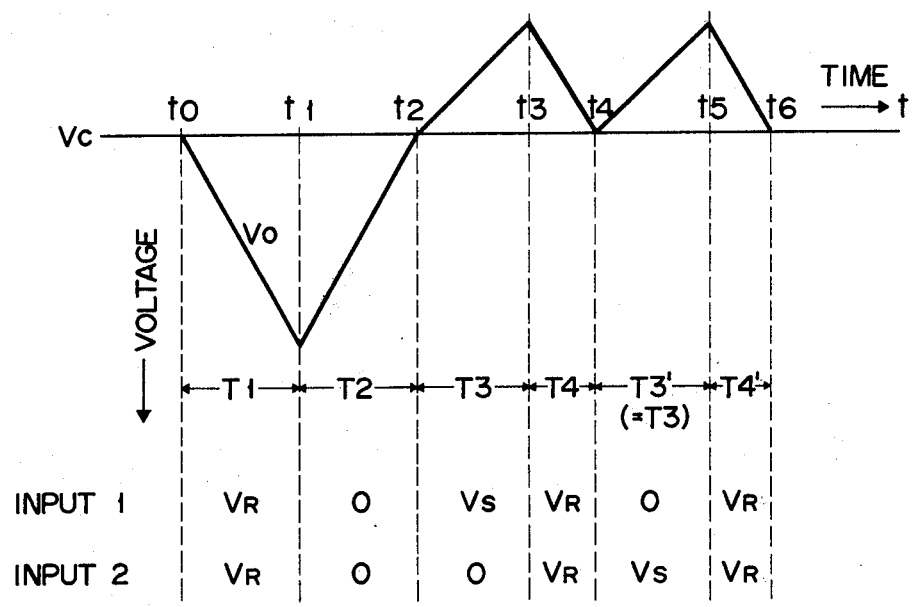

There will now be described by reference to FIG. 11 the second operation, where both input voltage $V_S$ and reference voltage $V_R$ have a positive polarity. The same process as in the first operation is used in determining a required amount of correction for automatic adjustment of the offset voltage of the D.C. amplifier by measuring the periods $T_1$, $T_2$. Namely, the input terminals 13a, 13b are impressed with reference voltage $V_R$ and, after a period $T_1$, with a grounding voltage 0 to measure a length of time $T_2$ required for the resultant voltage level to reach the level of a comparison reference voltage $V_C$. Said period $T_2$ is determined to be $T_1 + \Delta T$.

Thereafter, the input terminal 13a is supplied with an input voltage $V_S$ and the input terminal 13b with a grounding voltage 0 for a period $T_3$ (assuming $0 \leq V_S \leq V_R$). As a result, the level of an output voltage $V_O$ from the D.C. amplifier 11 rises above the level of a comparison reference voltage $V_C$ as illustrated in FIG. 11. At this time, a period $T_3$ is determined as follows:

$$T_3 = T_1 + \frac{1}{2}\Delta T$$

After passage of the period $T_3$, the input terminals 13a, 13b are supplied with a reference voltage $V_R$ to measure a period $T_4$ required for the level of an output voltage from the D.C. amplifier 11 to reach the level of a comparison reference voltage $V_C$.

Accordingly, the following results:

$$\{\frac{1}{2} V_S - (\frac{1}{2} V_R + \Delta V)\}T_3 + \{V_R - (\frac{1}{2} V_R + \Delta V)\}T_4 = 0.$$

Since, however, $\Delta T = T_2 - T_1$ and $T_3 = T_1 + \frac{1}{2}\Delta T$, the ratio $(V_S/V_R)$ of the levels of the input voltage $V_S$ and reference voltage $V_R$ is expressed as $$\frac{V_S}{V_R} = -\frac{T_4}{T_1} \cdot \frac{1 + \frac{\Delta T}{2T_1} \cdot \frac{1}{1 + \frac{\Delta T}{2T_1}}}{1 + \frac{\Delta T}{2T_1}} + 1 - \frac{\Delta T}{2T_1} \cdot \frac{1}{1 + \frac{\Delta T}{2T_1}}$$

Thus, the following approximation equation results:

$$\left(\frac{V_S}{V_R}\right)_A = \frac{(T_1 - T_4) - \frac{1}{2}\Delta T}{T_1}$$

An error of A-D conversion occurring in this case is extremely small as expressed by the following equation:

$$\left(\frac{V_S}{V_R}\right)_A - \frac{V_S}{V_R} = -\frac{1}{4}\left\{\frac{T_4}{T_1} \cdot \frac{1}{(1 + \frac{\Delta T}{2T_1})^2} + \frac{1}{1 + \frac{\Delta T}{2T_1}}\right\}\left(\frac{\Delta T}{T_1}\right)^2$$

As apparent from the above approximation equation, the ratio $(V_S/V_R)$ obtained by the above-mentioned operation does not denote the result of correcting the period $T_4$, but the result of correcting a value of $(T_1 - T_4)$.

When the period $T_4$ is fully measured, operation of the changeover switch assembly 14 is shifted to impress a grounding voltage 0 on the input terminal 13a and an input voltage $V_S$ on the input terminal 13b for a period $T_3'$. In this case, the period $T_3'$ is determined to be $T_1 + \frac{1}{2}\Delta T$. After passage of the period $T_3'$, the input terminals 13a, 13b are supplied with a reference voltage $V_R$ to measure a period $T_4'$ required for the level of an output voltage $V_O$ from the D.C. amplifier 11 to reach the level of a comparison reference voltage $V_C$.

A digital value of the level of the input voltage $V_S$ is determined from a mean between the measured values of the lengths of the periods $T_4$, $T_4'$.

The second operation comprises the steps of impressing a reference voltage $V_R$ on the two input terminals 13a, 13b during a period $T_1$; impressing a grounding voltage 0 on said input terminals 13a, 13b during a period $T_2$ to determine a required amount of a time difference $\Delta T$ for automatic adjustment of the offset voltage of the D.C. amplifier 11; determining a prescribed period $T_3$ used in actual measurement of the level of an input voltage $V_S$ to be $T_1 + \frac{1}{2}\Delta T$; *supplying the input terminal 13a* with an input voltage $V_S$ and the input terminal 13b with a grounding voltage 0 for the period $T_3$ thus determined; thereafter impressing a reference voltage $V_R$ on both input terminals 13a, 13b to measure a period $T_4$; supplying the input terminals 13a, 13b with a grounding voltage 0 in place of an input voltage $V_S$ to measure the length of the period $T_4$; and determining a digital amount of the level of an input voltage $V_S$ from an average between the measured values of the lengths of the periods $T_4$, $T_4'$.

The foregoing description refers to the case where the input terminals 13a, 13b were impressed with a reference voltage $V_R$ during the period $T_1$ and with a grounding voltage 0 during the period $T_2$ to determine a time difference $\Delta T$. However, it is considered to have the same effect, if the input terminals 13a, 13b are supplied with a grounding voltage 0 during a period $T_1$ and with reference voltage $V_R$ during the period $T_2$.

An A-D converter according to the foregoing embodiment is a dual slope type comprising two input resistors $R_1$, $R_2$ having nominally the same value of resistance. With this type of A-D converter, the input terminals 13a, 13b are supplied with an input voltage $V_S$ and reference voltage $V_R$ interchangeably. In the first stage of operation, the input terminals 13a, 13b are impressed first with a reference voltage and then with a grounding voltage 0 to determine the offset voltage of a D.C. amplifier used with an A-D converter in the form of a time difference $\Delta T$. In the second stage of operation, one of the input terminals is impressed with an input voltage $V_S$ to carry out the A-D conversion of the level of said input voltage $V_S$ with the time difference $\Delta T$ taken into account. In the third stage of operation, an input resistor corresponding to the other input terminal is supplied with an input voltage $V_S$ to carry out the A-D conversion of the level of said input voltage $V_S$. A final value of A-D conversion is determined from an average between A-D converted values obtained in the second and third stages of operation.

Table 4 shows all the manners or combination patterns in which various forms of voltage are interchangeably supplied to the input terminals 13a, 13b. Referring to Table 4, characters I, II, III, IV denote said combination patterns, and the character "input 1" shows a voltage impressed on the input terminal 13a and the character "input 2" represents a voltage supplied to the input terminal 13b.

Table 4

| COMBINATION | | $T_1$ | $T_2$ | $T_3$ | $T_4$ | $T_3' = T_3$ | $T_4'$ |
|---|---|---|---|---|---|---|---|
| I | INPUT 1 | $V_R$ | 0 | $V_S$ | 0 | $V_R$ | 0 |
| | INPUT 2 | $V_R$ | 0 | $V_R$ | 0 | $V_S$ | 0 |
| II | INPUT 1 | $V_R$ | 0 | $V_S$ | $V_R$ | 0 | $V_R$ |
| | INPUT 2 | $V_R$ | 0 | 0 | $V_R$ | $V_S$ | $V_R$ |
| III | INPUT 1 | 0 | $V_R$ | $V_S$ | $V_R$ | 0 | $V_R$ |
| | INPUT 2 | 0 | $V_R$ | 0 | $V_R$ | $V_S$ | $V_R$ |
| IV | INPUT 1 | 0 | $V_R$ | $V_S$ | 0 | $V_R$ | 0 |
| | INPUT 2 | 0 | $V_R$ | $V_R$ | 0 | $V_S$ | 0 |

Table 5 sets forth the values of $\Delta T$, $T_3$, $(V_S/V_R)_A$, $(V_S/V_R)'_A$ corresponding to all the above-mentioned combination patterns:

Table 2

| | $\Delta T$ | $T_3$ | $(\frac{V_S}{V_R})_A$ | $(\frac{V_S}{V_R})'_A$ |
|---|---|---|---|---|
| I | $T_2 - T_1$ | $T_4 - \frac{\Delta T}{2}$ | $\dfrac{T_4 - \frac{1}{2}\Delta T}{T_1}$ | $\dfrac{T_4' - \frac{1}{2}\Delta T}{T_1}$ |
| II | $T_2 - T_1$ | $T_1 + \frac{\Delta T}{2}$ | $\dfrac{(T_1 - T_4) - \frac{1}{2}\Delta T}{T_1}$ | $\dfrac{(T_1 - T_4') - \frac{1}{2}\Delta T}{T_1}$ |
| III | $T_2 - T_1$ | $T_1 - \frac{\Delta T}{2}$ | $\dfrac{(T_1 - T_4) + \frac{1}{2}\Delta T}{T_1}$ | $\dfrac{(T_1 - T_4') + \frac{1}{2}\Delta T}{T_1}$ |
| IV | $T_2 - T_1$ | $T_1 + \frac{\Delta T}{2}$ | $\dfrac{T_4 + \frac{1}{2}\Delta T}{T_1}$ | $\dfrac{T_4' + \frac{1}{2}\Delta T}{T_1}$ |

Normally, an output from an A-D converter is so designed as to cause the specified level range of an input signal lying between maximum and minimum values to correspond to a suitably chosen S number of digital steps. Namely, with a binary A-D converter, for example, an output corresponding to a minimum level of an input voltage is designated as 0000 ... 000 and an output corresponding to a maximum level thereof as 1111 ... 111. Values intermediate between the maximum and minimum levels are indicated by a counted number of digital steps expressed as $S = (2^m - 1)$ (m denoting a number of bits constituting an output from the A-D converter). The lengths of the periods $T_1$, $T_2$ are determined by counting clock pulses issued.

Where, in the foregoing embodiment, the maximum level of an input voltage $V_S$ is indicated by $V_R$ and the minimum level thereof by 0, (assuming $0 \leq V_S \leq V_R$), and a period $T_1$ is denoted by an S counted number of clock pulses, then a counted number $\frac{1}{2}(T_4 + T_4' - \Delta T)$ of clock pulses represents a corrected required A-D converted output. When, in the second operation, the period $T_1$ is denoted by an S counted number of clock pulses over the level range of an input signal, then a counted number $\frac{1}{2}(2T_1 - T_4 - T_4' - \Delta T)$ denotes a corrected required A-D converted output.

Where the maximum level of an input voltage is expressed as $J_{max}V_R$ and minimum level thereof as $J_{min}V_R$ (assuming $1 > J_{max} > J_{min} > 0$), then a desired A-D converted output is obtained by subtracting a counted number $(J_{min}/J_{max} - J_{min})S$ of clock pulses from a counted number of clock pulses representing a measured output produced by an A-D converter with the length of the period $T_1$ indicated by a counted number $(S/J_{max} - J_{min})$ of clock pulses. The requisite condition for determining an accurate A-D converted output is that a properly chosen number of clock pulses be allotted to the period $T_1$, and, if necessary, a suitable counted number of clock pulses be subtracted from a counted number of clock pulses representing a measured output from an A-D converter.

For improvement of the operational precision of an A-D converter, it is necessary to elevate the accuracy with which the lengths of the periods $T_1$, $T_2$, $T_3$, $T_4$, $T_3'$, $T_4'$ are measured. Since a length of time is measured by counting clock pulses, an error or time difference of at least one count is unavoidable. If, in such case, the above-mentioned counting number of clock pulses is multiplied by an integral number (a preferred multiplier being any of multiples of 2 such as 2, 4, 8, . . . ) and a product thus multiplied is divided by the same integral number used as a multiplier, then the above-mentioned error can be eliminated.

Figure 12:
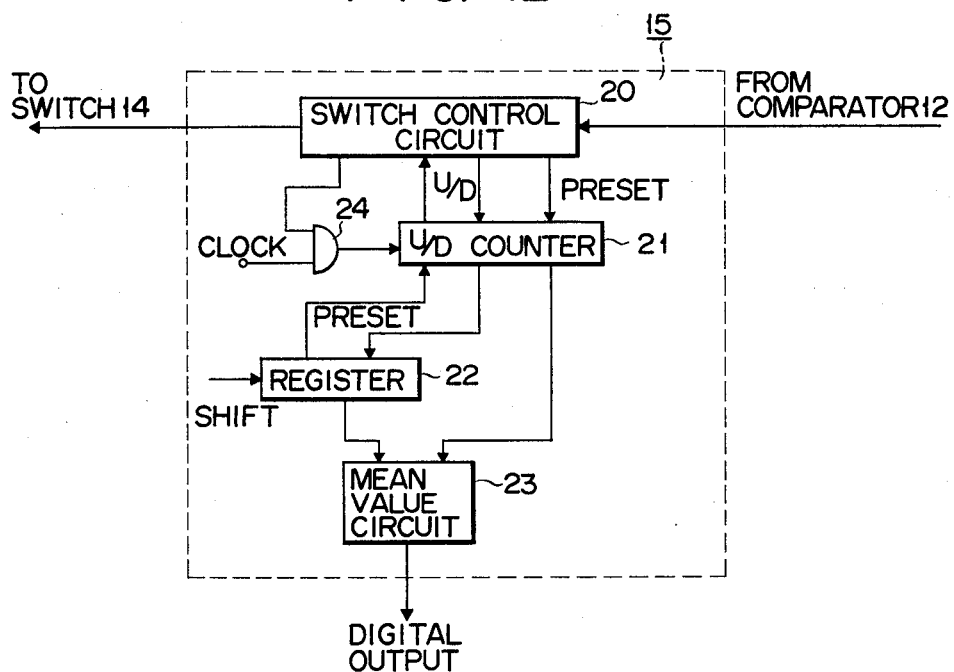
FIG. 12 is a block circuit diagram of a control circuit used with an A-D converter according to still another embodiment of the invention.
Figure 13:
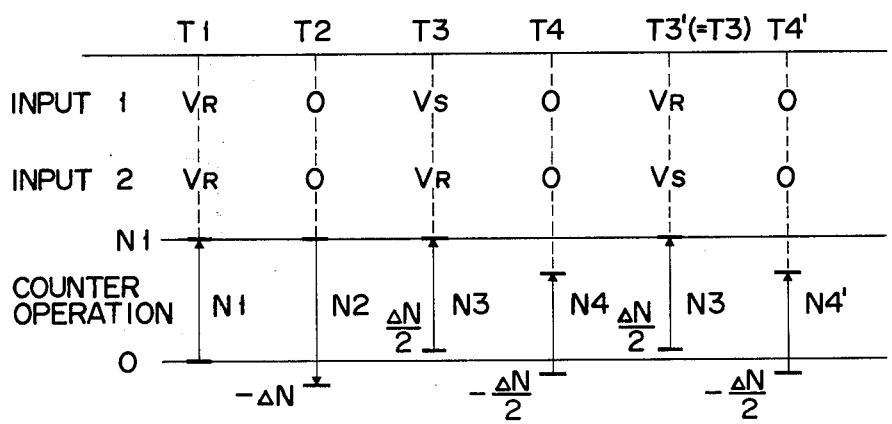
FIG. 13 presents the operating condition of the counter of FIG. 12.
Figure 14:
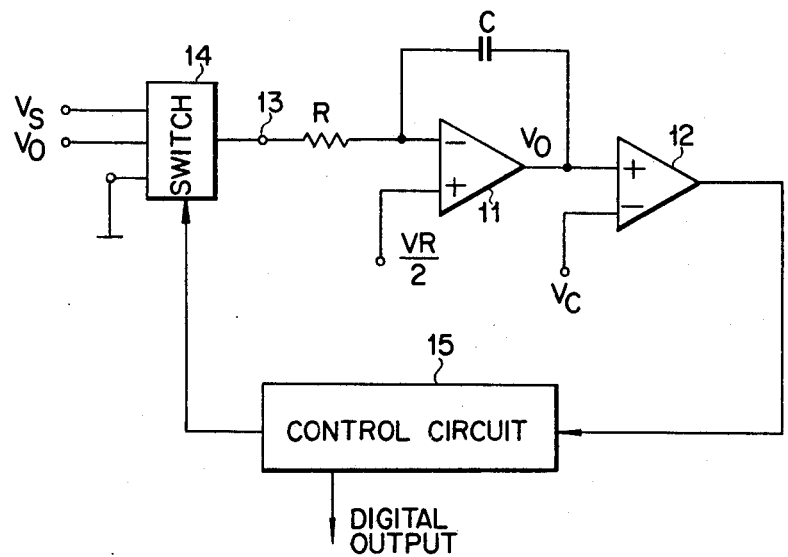
FIG.14 is a block circuit diagram of an A-D converter according to still further embodiment of the invention.
Figure 15:
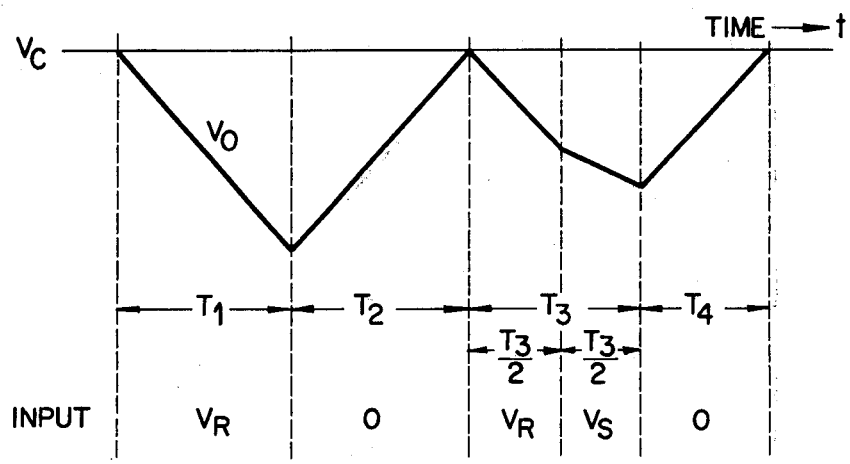
FIG. 15 graphically shows the operation of the circuit shown in FIG. 14.

FIG. 12 is a block circuit diagram of a switch control circuit 15 used with an A-D converter according to another embodiment of this invention to obtain an A-D converted output corrected by the above-mentioned process. FIG. 13 illustrates the operation of said switch control circuit 15.

Referring to FIG. 12, reference numeral 20 denotes a switch control circuit, which controls the operation of the changeover switch assembly 14, the presetting of the updown counter 21 and up- and down-counting. Numeral 22 is a shift register which stores a count made by the updown counter 21 and returns the stored count to the updown counter 21 afte a prescribed operation. Numeral 23 is a mean value calculation circuit, which produces an output representing an average between the numbers of clock pulses counted during the periods $T_4$, $T_4'$.

There will now be described by reference to FIG. 13 the operation of the switch control circuit 15 in relation to the first operation described in connection with FIG. 10.

Both input terminals 13a, 13b are impressed with a reference voltage $V_R$. The updown counter 21 is preset at zero, and thereafter counts up clock pulses received through the AND gate 24 up to a prescribed number $N_1$. This interval denotes a period $T_1$. When counting up clock pulses to the prescribed number $N_1$, the updown counter 21 gives forth a signal to the switch control circuit 20, which in turn controls the operation of the changeover switch assembly 14 so as to cause both input terminals 13a, 13b to be impressed with a grounding voltage. At this point the updown counter 21 is shifted from up- to down-counting. As the result, the updown counter 21 continues to count down clock pulses from the prescribed number $N_1$ until an output from the comparator 12 is supplied to said updown counter 21. This interval represents a period $T_2$. When a down-counting number of clock pulses is designated as $N_2$, then the count stored in the updown counter 21 is indicated as $N_1 = N_2 = -\Delta N$. This $\Delta N$ corresponds to a time difference $\Delta T$. Thereafter, a number of clock pulses showing $-\Delta N$ is transferred to the shift register 22, which in turn counts down the clock pulses received by one bit to change a notation prefixed before downcounting to a character denoting the previously counted clock pulses and thereafter returns a signal showing a down-counted number of clock pulses to the updown counter 21, namely, to preset it at a value of $\Delta N/2$. After the input voltages are exchanged for each other, the updown counter 21 ccounts up clock pulses to the prescribed number $N_1$, namely, by an extent $N_1 - \Delta N/2 = N_3$. This $N_3$ denotes a period $T_3$. When the updown counter 21 counts up clock pulses to the prescribed number $N_1$, the input voltages are exchanged for each other. The updown counter 21 is preset at a value of $-\Delta N/2$, and continues to count up clock pulses until said counter 21 receives an output from the comparator 12. A length of time required for the updown counter 21 to count a number $N_4$ corresponds to a period $T_4$. A count of $(N_4 - \Delta N/2)$ stored in the updown counter 21 at this time is shifted to the mean value calculation circuit 23, which is provided with a shift register for storing said count $(N_4 - \Delta N/2)$ shifted from the updown counter 21.

Upon completion of the above-mentioned operation, the voltages supplied to the input terminals 13a, 13b are exchanged for each other. The updown counter 21 is preset at $\Delta N/2$ and counts up clock pulses to the prescribed number $N_1$. Thereafter the input terminals 13a, 13b are supplied with a referential voltage $V_R$ in place of an input voltage $V_S$. The updown counter 21 is preset at $-\Delta N/2$ and continues to count up clock pulses until said counter 21 receives an output from the comparator 12. A length of time required for an $N_4'$ number of clock pulses to be counted up represents a period $T_4'$. At this time, a $(N_4' - \Delta N/2)$ counted number of clock pulses stored in the updown counter 21 is transmitted to the mean value calculation circuit 23.

This calculation circuit 23 determines a means value between $N_4' - \Delta N/2$ now received and $N_4 - \Delta N/2$ previously supplied thereto, and gives forth a mean value thus determined.

The foregoing description refers to the function of the switch control circuit 15 during the first operation. Said function is carried out in the same manner and with the same effect with respect to all the combination patterns of Table 5.

According to this invention, automatic adjustment of the offset voltage of a D.C. amplifier is carried out at each time of A-D conversion. Therefore, even where the offset value changes with time, an accurate value of A-D conversion is obtained. Further, the two input resistors $R_1$, $R_2$ are supplied with interchangeable voltages during the periods $T_3$, $T_4$, $T_3'$, $T_4'$. Therefore, an accurate value of A-D conversion can always be obtained, even where the two input resistors $R_1$, $R_2$ included in the integration circuit I deteriorate with time and ambient temperature changes.

As apparent from Table 4, the columns $T_3$, $(V_S/V_R)_A$, $(V_S/V_R)'_A$ of all the combination patterns I, II, III, IV include a term $\Delta T/2$. If $\Delta T$ denotes an odd number, then $\Delta T/2$ gives a fraction of 0.5, which should be discarded or reckoned as a unit, according as occasion demands. Namely, where the correction terms $\Delta T/2$ of the columns $T_3$, $(V_S/V_R)_A$, $(V_S/V_R)'_A$ shown in the combination pattern I have the same negative prefixed notation, and similarly said correction terms $\Delta T/2$ of the same columns indicated in the combination pattern IV have the same positive prefixed notation, then the above-mentioned fraction of 0.5 should be discarded in the former case, and reckoned as a unit in the latter case or vice versa so as to decrease errors of A-D conversion. Where the correction terms $\Delta T/2$ of the above-mentioned columns given in the combination patterns II, III have different prefixed notations, then the fraction of 0.5 should be discarded or reckoned as a unit with respect to both combination patterns II, III.

In the foregoing embodiment, the input terminals 13a, 13b were supplied with three forms of voltage, namely, input voltage, reference voltage and grounding voltage interchangeably. However, the grounding voltage may be regarded as a kind of reference voltage and need not be used as such. With this embodiment, therefore, voltages impressed on the input terminals 13a, 13b may be considered to consist of an analog input voltage $V_S$ and first and second reference voltages $V_R$ having the same polarity but different levels. An input voltage supplied to the noninversion input terminal of the D.C. amplifier 11 is chosen to have a level substantially representing a midpoint between the levels of the first and second referential voltages $V_R$, that is a level of $\frac{1}{2}(V_{R1} + V_{R2})$.

The foregoing description is not only applicable to the case where the first and second reference voltages $V_R$ had the same positive polarity (or one of said voltages has a zero level), but also the case where the first and second reference voltages $V_R$ have the same negative polarity (or one of said voltages has a zero level). In the latter case, a voltage impressed on the noninversion input terminal of the D.C. amplifier 11 also has a negative polarity.

With the above-mentioned embodiment, a single reversible updown counter 21 was used in the presetting and measurement of time. However, it is possible to provide a plurality of counters and cause them to share in the measurement of the periods $T_1$, $T_2$, $T_3$, $T_4$. Namely, it is possible to provide counters in a suitably chosen number, for example, to cause a single counter to measure the periods $T_1$, $T_2$ and separate counters to measure the periods $T_3$, $T_4$, $T_4'$.

What we claim is:

1. An analog-digital converter comprising a single integration resistor to which is selectively applied any one of an analog input voltage being measured, a first reference voltage having the same polarity as said analog input voltage, and a second reference voltage having the same polarity as said analog input voltage and having a value different from said first reference voltage, a D.C. amplifier having an inversion input terminal connected to said integration resistor and having a noninversion input terminal to which is applied a specified voltage having a substantially middle value between said first reference voltage and said second reference voltage, an integration capacitor connected between an output terminal of said D.C. amplifier and said inversion input terminal, an analog comparator having one input terminal to which is connected said output terminal of said D.C. amplifier and having the other input terminal to which is applied a comparing reference voltage, a counter for counting clock pulses for a specified length of time $T_1$ from the point of time when said analog comparator has detected that the output voltage of said D.C. amplifier has coincided with said comparing reference voltage, a changing over means for changing over a voltage being applied to said integration resistor to said second reference voltage at the point of time when said counter has counted clock pulses for said specified length of time $T_1$, a first measuring means for measuring by said counter or by another counter separately provided a length of time $T_2$ from the point of time when said voltage being applied has been changed over to said second reference voltage by said changing-over means to the point of time when said analog comparator again produces an output signal, a first determining means for determining an error in terms of time length due to the offset voltage of an integration circuit including said D.C. amplifier from said time length $T_2$ measured by said first measuring means and said specified time length $T_1$, a second determining means for determining a specified length of time $T_3$ required to measure said input voltage using said time length error determined by said first determining means, a first applying means for applying said first or second reference voltage to said integration resistor for an initial half period $T_3/2$ of said specified time length $T_3$ determined by said second determining means and thereafter applying said input voltage to said integration resistor for the remaining period $T_3/2$, a second applying means for applying said second or first reference voltage to said integration resistor after said prescribed voltages have been applied to said integration resistor by said first applying means, a second measuring means for measuring by said counter or by said another counter a length of time $T_4$ from the point of time when said voltage being applied to said integration resistor by said second applying means has been changed over to the point of time when said analog comparator again produces an output signal, and a means for obtaining a digital amount of said input voltage from said time length $T_4$ measured by said second measuring means and said specified time length $T_1$.

2. An analog-digital converter comprising first and second signal input terminals to which is selectively applied through an analog switch means any one of an input analog voltage, a first reference voltage and a second reference voltage; an integration circuit having first and second integration resistors selectively connected to said first and second signal input terminals, a D.C. amplifier having an inversion input terminal to which said first and second integration resistors are connected and a non-inversion input terminal to which is applied a specified voltage having an intermediate value between said first and second reference voltages, and an integration capacitor connected between an output terminal of said D.C. amplifier and said inverstion input terminal; an analog comparator having a first input terminal connected to said output terminal of said D.C. amplifier and a second input terminal to which is applied a comparing reference voltage; and a control circuit for selectively applying through said analog switch means any one of said analog voltage, said first reference voltage and said second reference voltage to said first and second signal input terminals upon receipt of an output signal of said analog comparator, characterized in that said control circuit comprises a counter for counting clock pulses for a specified length of time $T_1$ from the point of time when said analog comparator has detected that the output voltage of said D.C. amplifier has coincided with said comparing reference voltage, to produce an output signal while said first reference voltage is applied to said first and second signal input terminals, a changing-over means for changing over a voltage being applied to said first and second signal input terminals to said second reference voltage at the point of time when said counter has counted clock pulses for said specified length of time $T_1$, a first measuring means for measuring a length of time $T_2$ from the point of time when said voltage being applied has been changed over to said second reference voltage by said changing-over means to the point of time when said analog comparator again produces an output signal, a first determining means for determining from said time length $T_2$ measured by said first measuring means and said specified time length $T_1$ an error in terms of time length due to the offset voltage of said integtation circuit, a second determining means for determining a specified length of Time $T_3$ necessary to measure said input voltage using said time length errors determined by said first determining means, a first applying means for applying said input voltage to said first signal output terminal for an initial substantial half period $T_3/2$ of said specified time length $T_3$ determined by said second determining means and simultaneously applying said first or second reference voltage to said second signal input terminal and thereafter applying said reference voltages applied during said initial substantial half period $T_3/2$ to said first signal input terminal for the remaining substantial half period $T_3/2$ and simultaneously applying said input voltage to said second signal input terminal, a second applying means for applying, after said prescribed voltages have been applied by said first applying means to said first and second signal input terminals, said first or second reference voltage to said first and second signal input terminals, a second measuring means for measuring a length of time $T_4$ from the point of time when a voltage being applied by said second applying means has been changed over to the point of time when said analog comparator again produces an output signal, and a second determining means for determining a digital amount of said input voltage from said time length $T_4$ measured by said second measuring means and said specified time length $T_1$.

3. An analog-digital converter according to claim 2, characterized in that said control circuit comprises a counter for counting clock pulses for a specified length of time $T_1$ from the point of time when said analog comparator has detected that the output voltage of said D.C. amplifier has coincided with said comparing reference voltage, to produce an output signal while said first reference voltage is applied to said first and second signal input terminals, a changing-over means for changing over a voltage being applied to said first and second signal input terminals to said second reference voltage at the point of time when said counter has counted clock pulses for said specified length of time, a first measuring means for measuring by said counter separately provided a length of time $T_2$ from the point of time when said voltage being applied has been changed over to said second reference voltage to the point of time when said analog comparator again produces an output signal, a first determining means for determining an error in terms of time length due to the offset voltage of an integration circuit including said D.C. amplifier from said time length $T_2$ measured by said first measuring means and said specified time length $T_1$, a second determining means for determining a specified length of time $T_3$ required to measure said input voltage using said time length error determined by said first determining means, a first applying means for applying said input voltage to said first signal input terminal and simultaneously applying said first or second reference voltage to said second signal input terminal for said specified time length determined by said second determining means and thereafter applying said second or first reference voltage to said first and second signal input terminals, a second measuring means for measuring by said counter or by said another counter separately provided a length of time $T_4$ from the point of time when said voltage being applied by said first applying means has been changed over to the point of time when said analog comparator again produces an output signal, a second applying means for applying said first or second reference voltage to said first signal input terminal and simultaneously applying said input voltage to said second signal input terminal for said specified length of time $T_3$ after said time length $T_4$ has been measured by said second measuring means and thereafter applying said first or second reference voltage to said first and second signal input terminals, a third measuring means for measuring by said counter or by said another counter separately provided a time length $T_4'$ from the point of time when said voltage being applied to said signal input terminal by said second applying means has been changed over to the point of time when said analog comparator again produces an output signal, and a means for obtaining a digital amount of said input voltage using said time length $T_4'$ measured by said third measuring means and said time length $T_4$.

4. An analog-digital converter according to claim 2 wherein one of said first and second reference voltages is a ground level and the other is the same polarity as that of the input analog voltage.

5. An analog-digital converter comprising first and second signal input terminals to which is selectively applied through an analog switch means any one of an input analog voltage, a first reference voltage and a second reference voltage; an integration circuit having first and second integration resistors selectively connected to said first and second signal input terminals, a D.C. amplifier having an inversion input terminal to which said first and second integration resistors are connected and a non-inversion input terminal to which is applied a specified voltage having an intermediate value between said first and second reference voltages, and an integration capacitor connected between an output terminal of said D.C. amplifier and said inversion input terminal; an analog comparator having a first input terminal connected to said output terminal of said D.C. amplifier and a second input terminal to which is applied a comparing reference voltage; and a control circuit for selectively applying through said analog switch means any one of said analog voltage, said first reference voltage and said second reference voltage to said first and second signal input terminals, characterized in that said control circuit comprises a first changing-over means for changing over said analog switch means so as to apply said input voltage and either one of said first and second reference voltages to said first and second integration resistors, a second changing-over means for changing over said analog switch means so as to apply one of said first and second reference voltages to said first and second integration resistors commonly, a third changing-over means for changing over said analog switch means so as to apply said input voltage and either one of said first and second reference voltages which is same as said first changing-over means to said first and second integration resistors respectively in a manner combined differently from said first changing-over means, and means for obtaining a digital value corresponding to a sum of output voltages of said integrator obtained by said first, second and third changing-over means, whereby an A-D converted amount of said input voltage is obtained using said digital value obtained by said last means.

6. An analog-digital converter according to claim 5, characterized in that said control circuit comprises first and second counters for counting the clock pulses supplied at prescribed intervals, a first means for selecting said first reference voltage by said analog switch means and setting said first counter to a count-up condition, a second means for, when a count of said first counter has been arrived at a count $T_R$, selecting said second reference voltage by said analog switch means to apply the second reference voltage to said D.C. amplifier and setting said second counter to a count-down condition, a first memory circuit for storing therein the count of said second counter upon receipt of an output signal of said analog comparator produced by said second means when the output voltage of said D.C. amplifier has reached said comparing reference voltage, a third means for setting a value of one-half at first memory circuit to said second counter and setting a value of one-fourth at first memory circuit to said first counter after said analog comparator produces an output signal and selecting said analog input voltage by said analog switch means and setting said first and second counters to a count-down condition, and activating said first changing-over means, a first detecting means for detecting the coincidence between a count of said first counter and a value $-T_R/2$, a fourth means for, when said detecting means has detected said coincidence, activating said third changing-over means, a second detecting means for detecting the coincidence between a count of said second counter and a value $-T_R$, a fifth means for, when said second detecting means has detected said coincidence, activating said second changing-over means, and setting to the second counter $(T_1-T_2)/2$ from which the second counter commences its counting operation, and a second memory circuit for storing therein the count of said second counter upon receipt of an output signal of said analog comparator produced by said fifth means when the output voltage of said D.C. amplifier has reached said comparing reference voltage.

7. An analog-digital converter according to claim 5, wherein one of said first and second reference voltages is a ground level and the other in the same polarity as that of the input analog voltage.

* * * * *

UNITED STATES PATENT AND TRADEMARK OFFICE
CERTIFICATE OF CORRECTION

PATENT NO. : 4,063,236
DATED : December 13, 1977
INVENTOR(S) : Hiroshi Amemiya et al.

It is certified that error appears in the above-identified patent and that said Letters Patent are hereby corrected as shown below:

Claim 2, column 26, lines 41 and 42 delete "inverstion" and insert therefor --inversion--.

Claim 2, column 27, line 3, delete "integtation" and insert therefor --integration--.

Claim 2, column 27, line 8, delete "output" and insert therefor --input--.

Claim 6, column 23, line 4, delete "pled" and insert therefor --plied--.

Signed and Sealed this

Fourth Day of April 1978

[SEAL]

Attest:

RUTH C. MASON
*Attesting Officer*

LUTRELLE F. PARKER
*Acting Commissioner of Patents and Trademarks*